(12) United States Patent
Despesse et al.

(10) Patent No.: US 12,185,634 B2
(45) Date of Patent: Dec. 31, 2024

(54) ELECTRICAL ENERGY CONVERTER WITH PIEZOELECTRIC ELEMENT(S) AND SWITCHING ASSISTANCE CIRCUIT(S), ASSOCIATED ELECTRICAL ENERGY CONVERSION ELECTRONIC SYSTEM

(71) Applicant: Commissariat à l'énergie atomique et aux énergies alternatives, Paris (FR)

(72) Inventors: Ghislain Despesse, Grenoble (FR); Mustapha Touhami, Grenoble (FR); Valentin Breton, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 256 days.

(21) Appl. No.: 18/061,262

(22) Filed: Dec. 2, 2022

(65) Prior Publication Data
US 2023/0180615 A1    Jun. 8, 2023

(30) Foreign Application Priority Data

Dec. 3, 2021 (FR) ..................... 21 12926

(51) Int. Cl.
*H10N 30/00* (2023.01)
*H02M 1/00* (2006.01)
(Continued)

(52) U.S. Cl.
CPC .......... *H10N 30/40* (2023.02); *H02M 1/0058* (2021.05); *H02M 3/06* (2013.01)

(58) Field of Classification Search
CPC ....... H10N 30/40; H02M 1/0058; H02M 3/06
See application file for complete search history.

(56) References Cited

U.S. PATENT DOCUMENTS

| 12,009,746 | B2 * | 6/2024 | Perreault ............... H02M 3/158 |
| 2013/0169198 | A1 | 7/2013 | Wei et al. |
| 2017/0012556 | A1 * | 1/2017 | Jeong ................ H02M 3/33573 |

FOREIGN PATENT DOCUMENTS

| CN | 102522492 A | 6/2012 |
| FR | 3 064 850 B1 | 12/2019 |

(Continued)

OTHER PUBLICATIONS

French Preliminary Search Report Issued Jul. 1, 2022, in French Application 21 12926 filed on Dec. 3, 2021(with English Translation of Categories of Cited Documents), 3 pages.

(Continued)

*Primary Examiner* — Adolf D Berhane
*Assistant Examiner* — Afework S Demisse
(74) *Attorney, Agent, or Firm* — Oblon, McClelland, Maier & Neustadt, L.L.P.

(57) ABSTRACT

This electrical energy converter comprises:
 a first bridge comprising at least a first switching branch between two terminals of an input voltage and including two first switches connected at a first midpoint;
 a second bridge comprising at least a second switching branch between two terminals of an output voltage and including two second switches connected at a second midpoint;
 at least one piezoelectric assembly connected between respective first and second midpoints; and
 at least one switching aid circuit connected to a respective midpoint and configured to, via the flow of a previously received current, discharge a parasitic capacitance of a switch of the bridge to which it is connected, and respectively charge a parasitic capacitance of another switch of said bridge.

16 Claims, 10 Drawing Sheets

(51) Int. Cl.
*H02M 3/06* (2006.01)
*H10N 30/40* (2023.01)

(56) References Cited

FOREIGN PATENT DOCUMENTS

FR   3 086 471 A1   3/2020
FR   3 086 472 A1   3/2020

OTHER PUBLICATIONS

Pollet, "Convertisseurs DC-DC Piézoélectrique Avec Stockage Provisoire D'énergie Sous Forme Mécanique", URL:https://tel.archives-ouvertes.fr/tel-02415837/document, Nov. 15, 2019, 169 Pages.
Touhami et al., "Implementation of Control Strategy for Step-down DC-DC Converter Based on Piezoelectric Resonator", https://hai.archives-ouvertes.fr/hal-02978536, Oct. 26, 2020, 10 Pages.

* cited by examiner

ELECTRICAL ENERGY CONVERTER WITH PIEZOELECTRIC ELEMENT(S) AND SWITCHING ASSISTANCE CIRCUIT(S), ASSOCIATED ELECTRICAL ENERGY CONVERSION ELECTRONIC SYSTEM

CROSS-REFERENCE TO RELATED APPLICATIONS

This application is a U.S. non-provisional application claiming the benefit of French application No. 21 12926, filed Dec. 3, 2021, which is incorporated herein by reference in its entirety.

DOMAIN

The present invention relates to an electrical energy converter comprising a first switching bridge comprising at least one first switching branch, each first switching branch being connected between two input voltage supply terminals and comprising at least two first switches connected in series and linked together at a first midpoint; a second switching bridge comprising at least one second switching branch, each second switching branch being connected between two output voltage supply terminals and comprising at least two second switches connected in series and linked together at a second midpoint; and at least piezoelectric assembly, each piezoelectric assembly comprising at least one piezoelectric element and being connected between a respective first midpoint and a respective second midpoint.

The invention also relates to an electronic system for electrical energy conversion comprising such an electrical energy converter and an electronic device for controlling said converter.

The invention relates to the field of electronic systems for converting electrical energy, in particular those with a piezoelectric element, especially systems for converting into direct electrical current, i.e. DC-DC conversion systems, and also AC-DC conversion systems.

BACKGROUND

An electrical energy converter of the aforementioned type is known from the documents FR 3 064 850 B1, FR 3 086 471 A1, and FR 3 086 472 A1, as well as from the thesis manuscript "*Convertisseurs DC-DC piézoélectrique avec stockage provisoire d'énergie sous forme mécanique*" by Benjamin Pollet, and can be seen in FIGS. 19 and 20 of the document FR 3 086 472 A1.

The switches of the first and second switching bridges are operated cyclically at the main frequency of oscillation of the piezoelectric element about its preselected resonance mode with, between each application of a voltage via the closing of at least one switch, a phase in which the piezoelectric element is open-circuited (substantially constant load) via the opening of at least one switch. The closing of each switch is advantageously carried out at a voltage of approximately zero at its terminals, and in all cases, the closing of a switch never generates a significant variation in voltage at the terminals of the piezoelectric assembly(-ies) (less than 20%, and advantageously less than 10%, of the input voltage $V_{in}$ or of the output voltage $V_{out}$).

In the steady state, a command cycle typically comprises six distinct successive phases, namely three phases of substantially constant voltage across each piezoelectric element and three phases of substantially constant load across said piezoelectric element, alternating between phases of substantially constant voltage and phases of substantially constant load.

For controlling such an electrical energy converter, a control strategy typically consists of regulating the output voltage to track a desired setpoint, while ensuring zero voltage switching and synchronisation with the internal current of the piezoelectric element, as described in FR 3 064 850 B1, or in the article "*Implementation of control strategy for step-down dc-dc converter based on piezoelectric resonator*" by Mustapha Touhami et al (EPE'20 ECCE Europe, pp. 1-9).

However, the control of such an electrical energy converter is not always optimal.

SUMMARY

The purpose of the invention is therefore to provide an electrical energy converter with at least one piezoelectric element, with improved operation.

To this end, the invention has as its object an electrical energy converter comprising:

- a first switching bridge comprising at least one first switching branch, each first switching branch being connected between two input voltage application terminals and comprising at least two first switches connected in series and linked together at a first midpoint;
- a second switching bridge comprising at least one second switching branch, each second switching branch being connected between two input voltage application terminals and comprising at least two first switches connected in series and linked together at a first midpoint;
- at least one piezoelectric assembly, each piezoelectric assembly comprising at least one piezoelectric element and being connected between a respective first midpoint and a respective second midpoint; and
- at least one switching aid circuit, each switching aid circuit being connected to a respective one of the first and second midpoints, each switching aid circuit being configured to, via the flow of a previously received current, discharge at least one parasitic capacitance of a switch of the respective switching bridge to which it is connected, and respectively charge at least one parasitic capacitance of another switch of said switching bridge.

With the state-of-the-art electrical energy converter, the switching of the switches of the first and second switching bridges, which are cyclically commanded to obtain the aforementioned phases of the command cycle, induce a maximum swing of a total voltage of the piezoelectric assembly(-ies), denoted $V_p$, which swing ranges from $-V_{in}-V_{out}$ to $+V_{in}+V_{out}$, where $V_{in}$ is the value of the input voltage and $V_{out}$ is the value of the output voltage.

Each piezoelectric element is modelled as a capacitor and a resonant branch connected in parallel to the capacitor, the capacitance of said capacitor being referred to as the parallel capacitance, or blocked capacitance, or reference capacitance, and denoted $C_0$.

This voltage swing consumes part of an internal current $I_L$ of the piezoelectric element, flowing in the resonant branch and available to charge/discharge the parallel capacitance $C_0$. On the one hand, this internal current $I_L$ is limited by the piezoelectric material itself, due to its heating and limited deformation amplitude. On the other hand, the higher the internal current $I_L$, the higher the losses, namely the mechanical losses in the piezoelectric material proportional to the square $I_L^2$ of the internal current $I_L$ and the conduction losses in the switches. Furthermore, the dielectric losses in the piezoelectric material increase with the voltage swing.

With the electrical energy converter according to the invention, the or each switching aid circuit makes it possible to limit this voltage swing, by facilitating certain switchings of the first and second switching bridges, as will be described in more detail later.

Preferably, the or each switching aid circuit then comprises an additional inductor or piezoelectric element, in addition to the piezoelectric assembly(-ies) connected between the respective first and second midpoints.

In other beneficial aspects of the invention, the electrical energy converter comprises one or more of the following features, taken in isolation or in any technically possible combination:
- the switching bridge to which a respective switching aid circuit is connected comprises two switching branches, and said switching aid circuit is then connected between the respective midpoints (38; 48) of the two switching branches of said bridge;
- the first switching bridge comprises two first switching branches, and the second switching bridge has two second switching branches; and the converter comprises two piezoelectric assemblies, each connected between respective first and second midpoints, the midpoints between which the piezoelectric assemblies are connected being distinct from one piezoelectric assembly to another;
- the switching bridge to which a respective switching aid circuit is connected comprises a single switching branch, and said switching aid circuit is then connected between the midpoint and an end of said switching branch of said bridge;
- the converter comprises two switching aid circuits, a first switching aid circuit being connected to the first switching bridge and a second switching aid circuit being connected to the second switching bridge;
- each switching aid circuit comprises no controllable switch, in particular no transistor;
- each switching aid circuit comprises an element selected from the group consisting of: an inductor; a first assembly formed of an inductor and a diode connected in series; a second assembly formed of an inductor and a capacitor connected in series; and an additional piezoelectric element;
- each switching aid circuit preferably consisting of an element selected from said group;
  - the switching aid circuit comprises an inductor and a diode connected in series, and the diode is oriented according to a direction of flow of the previously received current, the diode being configured to block the flow of a current going from the positive polarity to the negative polarity of a possible direct voltage component of said current;
  - the switching aid circuit comprises an additional piezoelectric element, each piezoelectric element has a reference capacitance, each piezoelectric element being modelled as a capacitor and a resonant branch connected in parallel to the capacitor, the reference capacitance being the capacitance of said capacitor, and
  the reference capacitance of the additional piezoelectric element is at least three times less than the reference capacitance of the piezoelectric element(s) of each piezoelectric assembly connected between respective first and second midpoints;
  the switches of the first and second switching bridges can be commanded to alternate between phases of substantially constant voltage across each piezoelectric assembly and phases of substantially constant load across each piezoelectric assembly;
  the previously received current is obtained in at least one substantially constant voltage phase preceding the discharge of the at least one parasitic capacitance of a switch and the charging of the at least one parasitic capacitance of another switch, respectively, by the respective switching aid circuit;
  each piezoelectric assembly consists of one of the group consisting of: a single piezoelectric element; a plurality of piezoelectric elements connected in series; a plurality of piezoelectric elements connected in parallel; a piezoelectric element and an auxiliary capacitor connected in series; a piezoelectric element and an auxiliary capacitor connected in parallel; and an arrangement of a plurality of parallel branches, each branch comprising one or more piezoelectric elements connected in series or an auxiliary capacitor;
  the auxiliary capacitor preferably having a capacitance greater than, preferably at least three times greater than, a reference capacitance of the piezoelectric element(s), each piezoelectric element being modelled as a capacitor and a resonant branch connected in parallel to the capacitor, the reference capacitance being the capacitance of said capacitor.

The invention also relates to an electronic system for electrical energy conversion comprising an electrical energy converter and an electronic device for operating the electrical energy converter, the electrical energy converter being as defined above.

BRIEF DESCRIPTION OF THE DRAWINGS

These features and advantages of the invention will appear more clearly upon reading the following description, given solely as a non-limiting example, and made in reference to the attached drawings, in which.

DETAILED DESCRIPTION

The phrase "substantially equal to" means being equal within 10%, and preferably within 5%.

Figure 1:
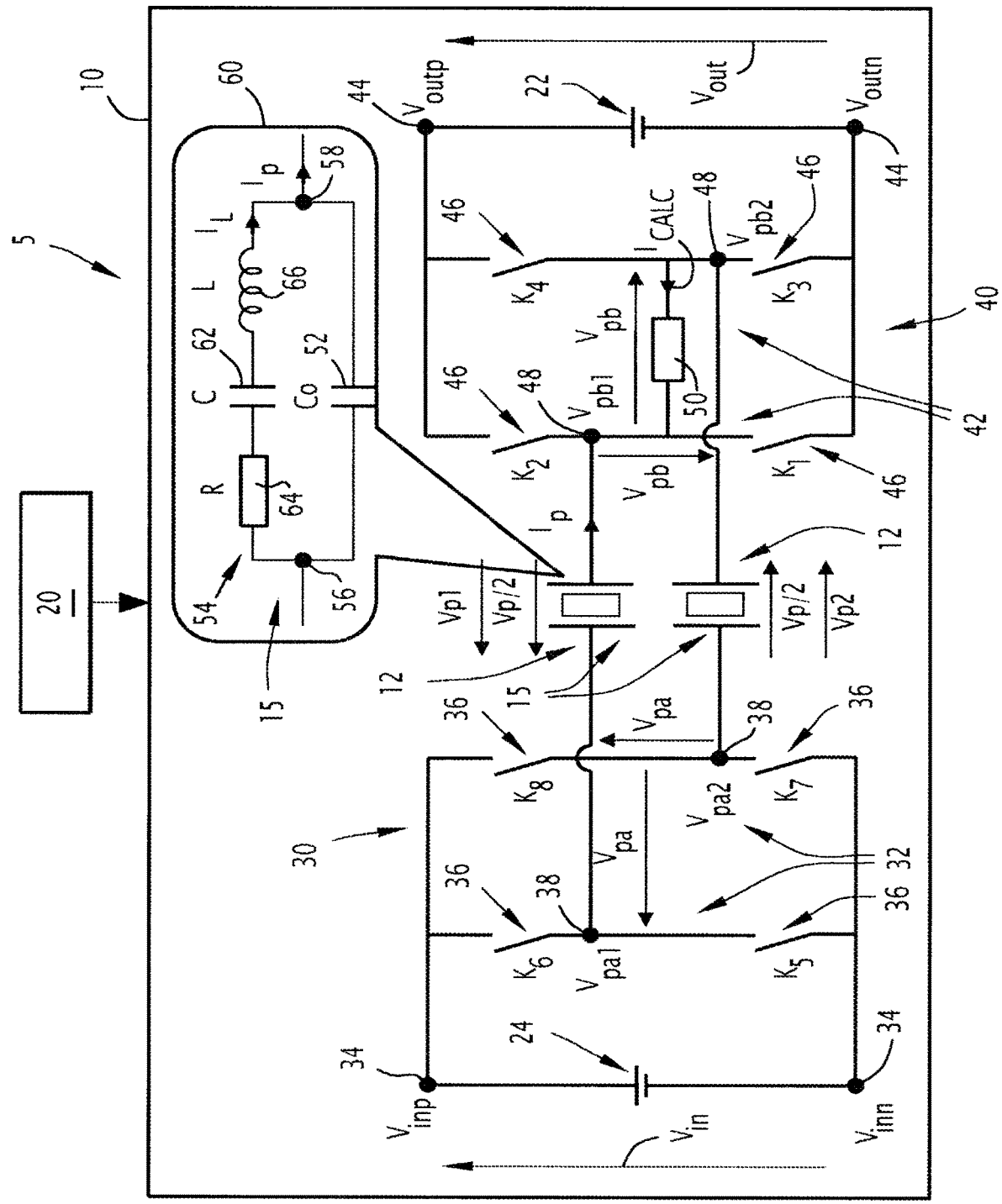
FIG. 1 is a schematic representation of an electronic system for electrical energy conversion according to the invention, comprising an electrical energy converter and an electronic device for controlling said converter, the converter comprising a first switching bridge with two first switching branches each formed by two first switches connected in series and linked at a first midpoint, a second switching bridge with two second switching branches each formed by two second switches connected in series and linked at a second midpoint, two piezoelectric assemblies connected between respective first and second midpoints, and a switching aid circuit connected between first and second midpoints of the second bridge, the first, and respectively second, bridges being connected between two terminals for applying an input voltage, and respectively between two terminals for supplying an output voltage.

In FIG. 1, an electronic system 5 for electrical energy conversion comprises an electrical energy converter 10 comprising at least one piezoelectric assembly 12, each piezoelectric assembly 12 having at least one piezoelectric element 15 and several switches $K_1$, $K_2$, $K_3$, $K_4$, $K_5$, $K_6$, $K_7$, $K_8$ capable of being commanded to alternate between phases with a substantially constant voltage across the terminals of the piezoelectric assembly(-ies) 12 and phases with a substantially constant charge across the terminals of said piezoelectric assembly(-ies) 12; and an electronic device 20 for operating the electrical energy converter 10.

The electronic system 5 for electrical energy conversion is typically a DC power conversion system, such as a DC-DC conversion system capable of converting a first inputted DC power or voltage into a second outputted DC power or voltage, or an AC-DC conversion system capable of converting an inputted AC power or voltage into an outputted DC power or voltage of the conversion system 5.

When the electrical energy conversion system 5 is an AC-DC conversion system, the electrical energy conversion system 5 preferably further comprises a voltage rectifier, not shown, connected to the input of the electrical energy converter 10 and capable of rectifying the AC electrical voltage received at the input of the conversion system 5 to provide a rectified electrical voltage at the input of the converter 10, the electrical energy converter 10 preferably being a DC-DC converter capable of converting DC electrical energy or voltage into another DC electrical energy or voltage. The voltage rectifier is for example a bridge rectifier, such as a diode bridge. Alternatively, the voltage rectifier is formed in part by switches of the converter 10.

Figure 2:
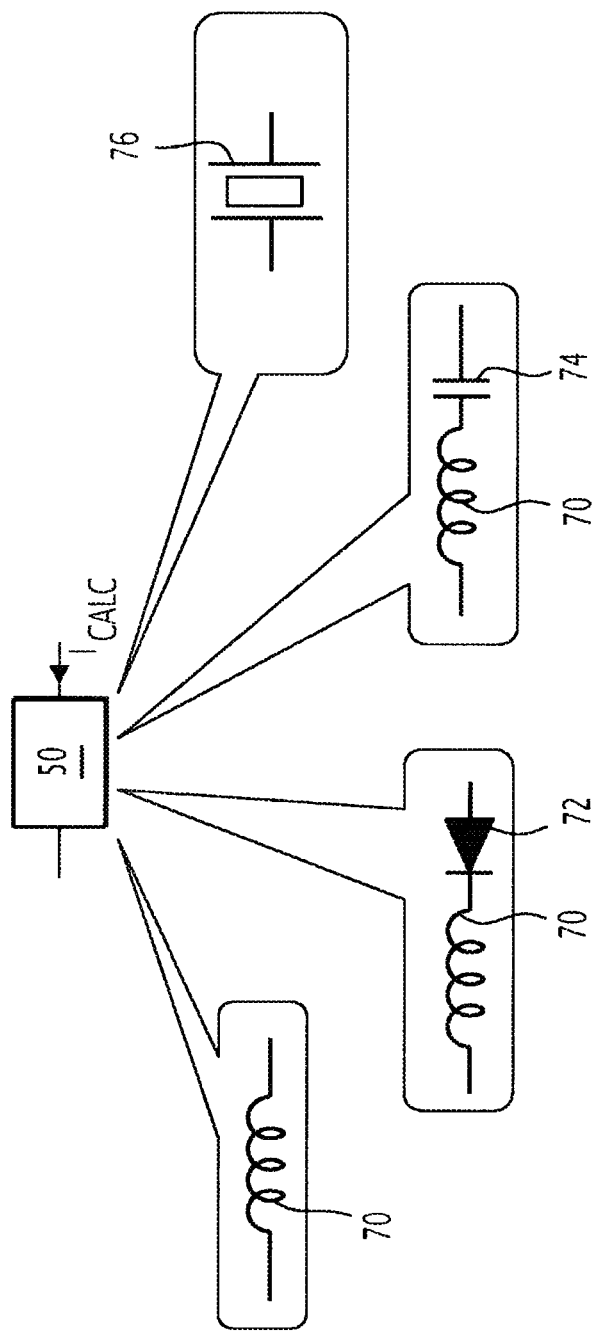
FIG. 2 is a schematic representation of different types of switching support circuits.

The skilled person will note that these different examples for the conversion system 5, whether it is a DC-DC conversion system or an AC-DC conversion system, are also presented in the documents FR 3 086 471 A1 and FR 3 086 472 A1, in particular in relation to their FIGS. 1 and 2.

The electrical energy converter 10 is preferably a DC-DC converter, and is also called a DC-DC converter. The DC-DC converter is generally intended to regulate a supply voltage to a load 22 to a stable value, by being supplied by a power source 24 providing a substantially DC voltage. The power source 24 is for example a battery or a solar panel.

The electrical energy converter 10 is then configured to raise the value of the DC voltage between its input and its output, and is then also called a DC-DC step-up converter; or is configured to lower the value of the DC voltage between its input and its output, and is then called a DC-DC step-down converter.

The electrical energy converter 10 is configured to provide N separate output voltage(s) from E separate input voltage(s), where E and N are each an integer greater than or equal to 1.

In the example shown in FIG. 1, the electrical energy converter 10 is configured to provide an output voltage, denoted $V_{out}$, from an input voltage, denoted $V_{in}$, whereby the number E of input voltages and the number N of output voltages are each equal to 1.

Alternatively, not shown, the electrical energy converter 10 is configured to provide a plurality of distinct output voltages from one or more distinct input voltages, where the number N of distinct output voltages is greater than 1. Also alternatively, the electrical energy converter 10 is configured to provide one or more distinct output voltages from a plurality of distinct input voltages, where the number E of distinct input voltages is greater than 1. Also alternatively, the electrical energy converter 10 is configured to provide a plurality of distinct output voltages from a plurality of distinct input voltages, where the numbers E and N are each greater than 1.

Where the electrical energy converter 10 is configured to provide a number of distinct output voltages, the converter 10 is typically connected to a number of loads 22, as shown for example in FIG. 17 of FR 3 086 471 A1.

Similarly, when the electrical energy converter 10 is configured to provide one or more distinct output voltages from a plurality of distinct input voltages, then the converter 10 is powered by a plurality of energy sources 24.

The electrical energy converter 10 comprises the piezoelectric assembly(-ies) 12 each formed of one or more piezoelectric elements 15, and the control device 20 is configured to operate the piezoelectric material of the piezoelectric element(s) 15 at its/their resonance in order to exploit load transfer phases to dispense with the use of an inductive element, while regulating the output voltage by maintaining the resonance of the piezoelectric material, i.e. with repeated switching cycles at an operating frequency depending on the resonance frequency of the piezoelectric element(s) 15, and by adjusting the durations of the respective switching phases within the resonance cycle.

In the steady state, the piezoelectric assembly(-ies) 12 exchange a load and substantially zero power over a resonant cycle, except for losses. In other words, each piezoelectric assembly 12 gives back substantially as much energy and load as it receives over a period. Two operating conditions then apply to the steady state/settled state, namely load balance and energy balance over a resonant period. Even if during transients (start-up, variation of voltage steps, change of output current) this balance is not respected, it must still be possible to achieve it in steady state. In particular, this requires a certain arrangement of the voltage steps during the resonance period. For example, for three voltage step operation, the two extreme voltage steps are controlled during one half-period of a given polarity of a current $I_L$ flowing through the piezoelectric elements 15, and the intermediate voltage step is controlled during the other half-period of opposite polarity of the current $I_L$ flowing through the piezoelectric elements 15.

As is known per se, the mechanical oscillation of the piezoelectric assembly 12 is approximately sinusoidal, as represented in FIGS. 3, 7, 8 and 10 by the curve 26 showing the total mechanical deformation of the piezoelectric element(s) 12 during a respective resonance cycle. When the electrical energy converter 10 comprises a plurality of piezoelectric assembly(-ies) 12, as in the examples of FIGS. 1, 5 and 6, the total mechanical deformation of the piezoelectric assemblies 12 is the sum of the elementary mechanical deformations of each of the piezoelectric assemblies 12.

An increase or decrease in the energy stored over a period leads to an increase or decrease in the oscillation amplitude, respectively. Furthermore, during a phase with a substantially constant load at the terminals of the piezoelectric assembly(-ies) 12, i.e. when the piezoelectric assembly(-ies) 12 is/are placed in a substantially open electrical circuit, with little exchange of electrical loads between the piezoelectric assembly(-ies) 12 and the outside, an increase in the amplitude of the oscillations causes an increase in the rate of change of the voltage $V_p$ across the piezoelectric assembly(-ies) 12, and during a phase with substantially constant voltage across the piezoelectric assembly(-ies) 12, this increase in the amplitude of the oscillations leads to an increase in a current $I_p$ exchanged between the piezoelectric assembly(-ies) 12 and the voltage stages.

Substantially constant load means an exchange of charge with the exterior that is less than 10% of the load that would have been exchanged with the exterior if the voltage had been kept constant. In other words, a substantially constant load means a variation in load of less than 10% of the load that would have been exchanged with the exterior of the piezoelectric piezoelectric assembly(-ies) 12 if the voltage across the piezoelectric piezoelectric assembly(-ies) 12 had been held constant over the time period in question.

Substantially open electrical circuit means a circuit in which any leakage current leads to a variation in the load of the piezoelectric assembly(-ies) 12 of less than 10% of the load that would have been exchanged with the exterior of the piezoelectric assembly(-ies) 12 if the voltage across the piezoelectric assembly(-ies) 12 had been held constant over the time period in question.

Substantially constant voltage means a voltage variation of less than 20%, preferably less than 10%, of the input or output voltage of the converter 10. For example, if the input voltage of the converter 10 is 100V, then the voltage variation during each phase at substantially constant voltage, is less than 20% of this voltage, i.e. less than 20V; preferably less than 10% of this voltage, i.e. less than 10V. Each phase with substantially constant voltage is also called a voltage step.

The converter 10 then comprises a plurality of switches $K_1$, $K_2$, $K_3$, $K_4$, $K_5$, $K_6$, $K_7$, $K_8$ capable of being controlled to alternate between phases of substantially constant voltage and phases of substantially constant load across the piezoelectric assembly(-ies) 12, within periods of substantially constant duration corresponding to the operating frequency of the converter 10, depending on the resonant frequency, also known as natural frequency, of the piezoelectric assembly(-ies) 12. The phases with a substantially constant load make it possible, in steady state or permanent operation, to switch from one constant voltage to another and to close the switches that must be closed when the voltage at their terminals is preferably zero, in order to have a so-called zero voltage switching mode, also called ZVS. At the very least, the closing of a switch must not result in a sudden variation of the voltage $V_p$ (less than 20%, and preferably less than 5%, of the input voltage $V_{in}$ or output voltage $V_{out}$), which would be a source of significant losses, the capacitance $C_0$ of the piezoelectric being significantly greater (typically at least 3 times greater) than the parasitic capacitance of the switches.

In particular, the converter 10 comprises a first switching bridge 30 comprising at least one first switching branch 32, each first switching branch 32 being connected between two input voltage $V_{in}$ application terminals 34 and comprising at least two first switches 36 connected in series and linked together at a first midpoint 38. Of the two application terminals 34, one has a lower potential, denoted $V_{inn}$, than the other, denoted $V_{in}p$.

Figure 5:
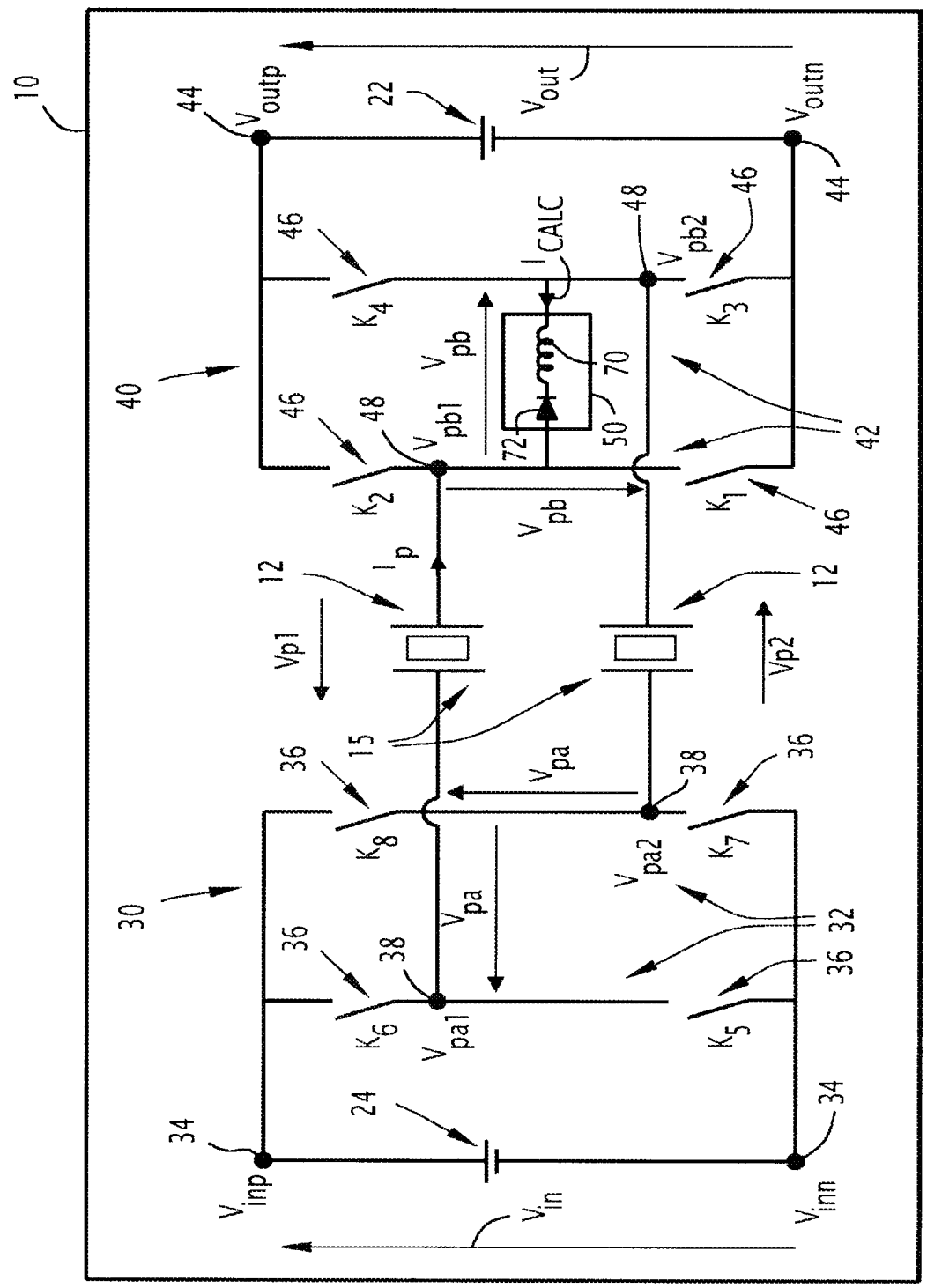
FIG. 5 is a view similar to FIG. 1, according to an example embodiment wherein the switching aid circuit consists of an inductor and a diode connected in series.
Figure 6:
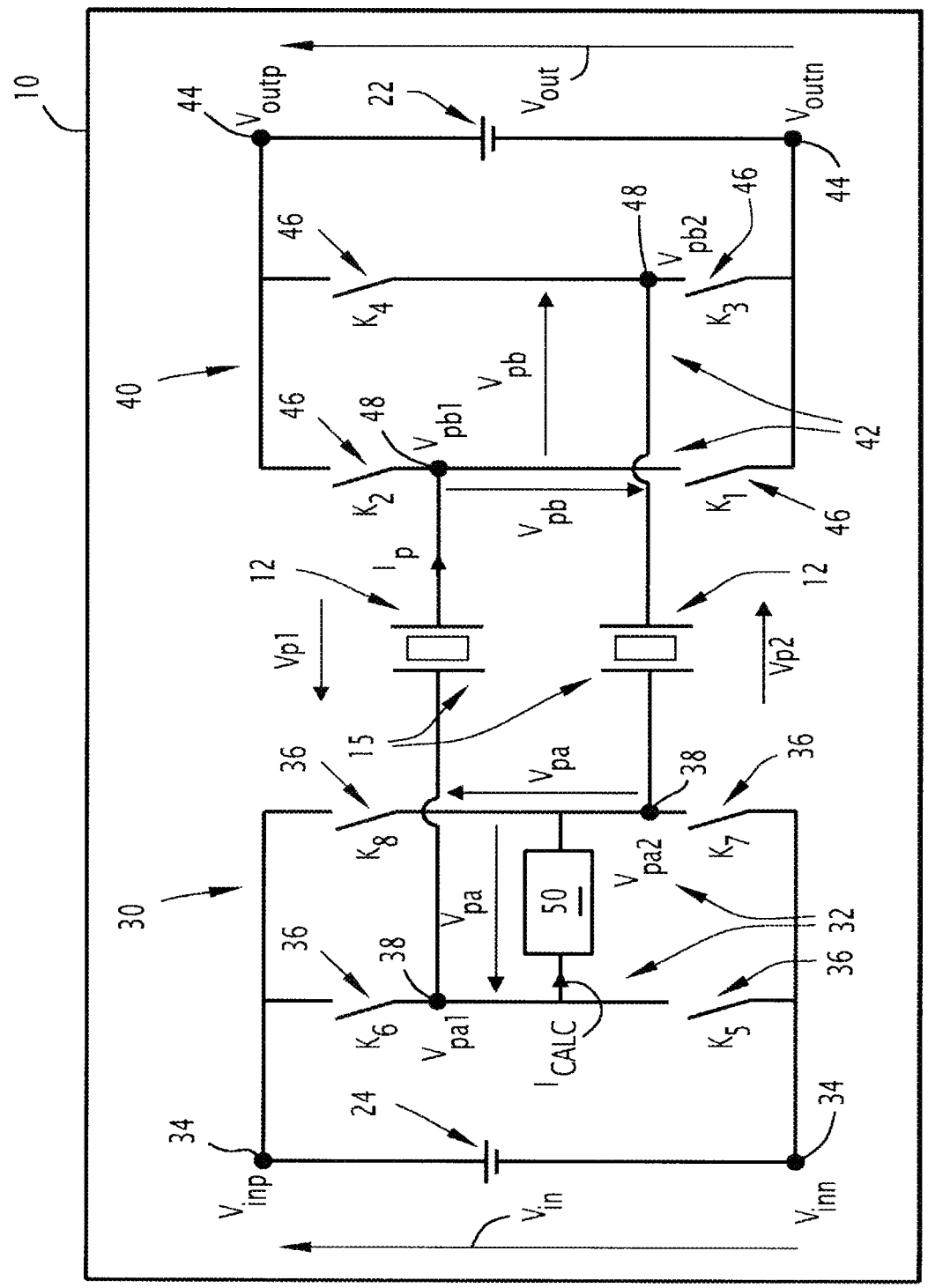
FIG. 6 is a view similar to FIG. 1, according to a second embodiment of the electrical energy converter, wherein the switching aid circuit is connected between the first and second midpoints of the first bridge.

In the examples of FIGS. 1, 5 and 6, the first switching bridge 30 comprises two first switching branches 32 connected in parallel between the two application terminals 34. In these examples, the first switching bridge 30 preferably consists of said two first switching branches 32.

Figure 9:
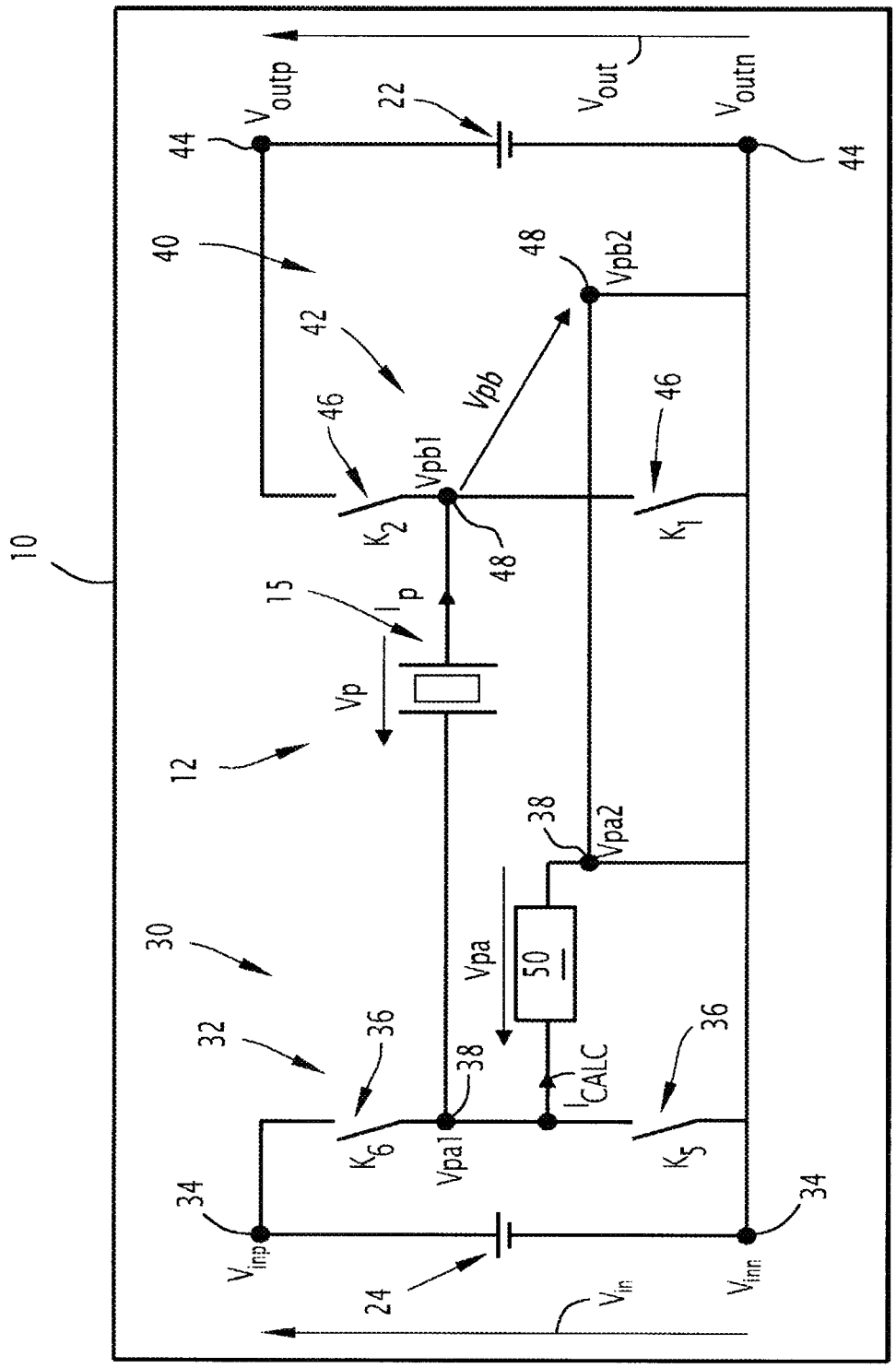
FIG. 9 is a view similar to FIG. 1, according to a third embodiment of the electrical energy converter, wherein each of the first and second switching bridges comprises a single switching branch.

In the example shown in FIG. 9, the first switching bridge 30 comprises a single first switching branch 32 connected between the two application terminals 34. In this example, the first switching bridge 30 preferably consists of this single first switching branch 32.

In the examples of FIGS. 1, 5, 6 and 9, each first switching branch 32 comprises two first switches 36 connected in series and joined at the first midpoint 38. Each first switching branch 32 preferably consists of the first two switches 36.

In the examples of FIGS. 1, 5, and 6, with two first switching branches 32, the first two switches 36 are denoted $K_5$, $K_6$ for one of the first two switching branches 32, and $K_7$, $K_8$ for the other of the first two switching branches 32 respectively.

In the example shown in FIG. 9, with a single first switching branch 32, the first two switches 36 are denoted $K_5$, $K_6$ for said first switching branch 32.

The converter 10 comprises a second switching bridge 40 comprising at least one second switching branch 42, each second switching branch 42 being connected between two output voltage $V_{out}$ supply terminals 44 and comprising at least two second switches 46 connected in series and linked together at a second midpoint 48. Of the two supply terminals 44, one has a lower potential, denoted $V_{outn}$, than the other, denoted $V_{outp}$.

In the examples of FIGS. 1, 5 and 6, the second switching bridge 40 comprises two second switching branches 42 connected in parallel between the two application terminals 44. In these examples, the second switching bridge 40 preferably consists of said two second switching branches 42.

In the example shown in FIG. 9, the second switching bridge 40 comprises a single second switching branch 42 connected between the two application terminals 44. In this example, the second switching bridge 40 preferably consists of this single second switching branch 42.

In the examples of FIGS. 1, 5, 6 and 9, each second switching branch 42 comprises two second switches 46 connected in series and joined at the second midpoint 48. Each second switching branch 42 preferably consists of the two second switches 46.

In the examples of FIGS. 1, 5, and 6, with two second switching branches 42, the two second switches 46 are denoted $K_1$, $K_2$ for one of the two second switching branches 42, and $K_3$, $K_4$ for the other of the two second switching branches 42 respectively.

In the example shown in FIG. 9, with a single second switching branch 42, the two second switches 46 are denoted $K_1$, $K_2$ for said second switching branch 42.

In the examples of FIGS. 1, 5 and 6, the converter 10 comprises two piezoelectric assembly(-ies) 12, each connected between respective first 38 and second 48 midpoints, the midpoints 38, 48 between which the piezoelectric assemblies 12 are connected being distinct from one piezoelectric assembly(-ies) 12 to the other, each switching bridge 30, 40 then comprising two respective switching branches 32, 42.

In the example shown in FIG. 9, the converter 10 comprises a piezoelectric assembly 12 connected between the first midpoint 38 of the single first branch 32 and the second midpoint 48 of the single second branch 42.

According to the invention, the converter 10 further comprises at least one switching aid circuit 50, each switching aid circuit 50 being connected to a respective one of the first 38 and second 48 midpoints, each switching aid circuit 50 being configured to, via the flow of a previously received current, discharge a parasitic capacitance of a switch 36, 46 of the respective switching bridge 30, 40 to which it is connected, and respectively charge a parasitic capacitance of another switch 36, 46 of said switching bridge 30, 40.

In the examples of FIGS. 1, 5, 6 and 9, the converter 10 comprises a single switching aid circuit 50 connected to either the first switching bridge 30 or the second switching bridge 40. In the examples shown in FIGS. 1 and 5, the single switching aid circuit 50 is connected to the second switching bridge 40. In the examples shown in FIGS. 6 and 9, the single switching aid circuit 50 is connected to the first switching bridge 30.

In the examples shown in FIGS. 1, 5, and 6, the second switching bridge 40 has two second switching branches 42, respectively the first switching bridge 30 has two first switching branches 32; and the switching aid circuit 50 is connected between the respective midpoints 38, 48 of the two switching branches 32, 42 of said bridge 30, 40. In the examples shown in FIGS. 1 and 5, the switching aid circuit 50 is connected between the second midpoints 48 of the two second switching branches 42 of the second switching bridge 40. Likewise, in the example shown in FIG. 6, the switching aid circuit 50 is connected between the first midpoints 38 of the two first switching branches 32 of the first switching bridge 30.

In the example shown in FIG. 9, the first switching bridge 30 comprises the single first switching branch 32, and the switching aid circuit 50 is then connected between the first midpoint 38 of the first leg 32 of the first switching bridge 30 and one end of said first leg 32, which end is itself connected to a respective application terminal 34.

Alternatively, not shown, the converter 10 comprises two switching aid circuits 50, a first switching aid circuit being connected to the first switching bridge 30 and a second switching aid circuit being connected to the second switching bridge 40.

In this alternative, the skilled person will understand that each switching aid circuit 50 is capable of being connected between the respective midpoints 38, 48 of the two switching branches 32, 42 when the bridge 30, 40 to which it is connected comprises two respective switching branches 32, 42; or is capable of being connected between the midpoint 38, 48 and a respective end of the corresponding switching branch 32, 42 when the bridge 30, 40 to which it is connected comprises a single switching branch 32, 42.

In addition, when a respective switching aid circuit 50 discharges a parasitic capacitance of at least one switch 36, 46 of the respective switching bridge 30, 40 to which it is connected, and respectively charges at least one parasitic capacitance of another switch 36, 46 of said switching bridge 30, 40, the control device 20 is preferably further configured to command the opening of at least one first switch 36 and/or at least one second switch 46 arranged in series in a loop including said switching aid circuit 50, the piezoelectric assembly(-ies) 12, some of the first switches 36 of the first bridge 30 and some of the second switches 46 of the second bridge 40. The opening of the at least one first switch 36 and/or the at least one second switch 46 included in this loop then prevents the switching aid circuit 50 from significantly charging or alternatively discharging a reference capacitance $C_0$, described below, of the piezoelectric element(s) 15 of the piezoelectric assembly(-ies) 12 during this phase which is at substantially constant load, and then better respects the constancy of the load during the substantially constant load phase during which the respective switching aid circuit 50 is activated, i.e. implemented.

According to this complement, when the respective switching aid circuit 50 that is activated is a switching aid circuit connected to the first switching bridge 30, the control device 20 is preferentially configured to command the opening of at least one second switch 46 arranged in series in said loop, as defined in the preceding paragraph. As a corollary, when the respective switching aid circuit 50 that is activated is a switching aid circuit connected to the second switching bridge 40, the control device 20 is preferentially configured to command the opening of at least one first switch 36 arranged in series in said loop.

Each switch in the converter 10, i.e. each of the first 36 and second 46 switches, also denoted $K_1$, $K_2$, $K_3$, $K_4$, $K_5$, $K_6$, $K_7$, $K_8$, is preferably a unidirectional current and unidirectional voltage switch. The switch $K_1$, $K_2$, $K_3$, $K_4$, $K_5$, $K_6$, $K_7$, $K_8$, comprises for example a transistor, or a diode, or a transistor and a diode in antiparallel, not shown. The switch $K_1$, $K_2$, $K_3$, $K_4$, $K_5$, $K_6$, $K_7$, $K_8$, preferably consists of the transistor, or the diode, or the transistor and the diode in antiparallel. Alternatively, the switch $K_1$, $K_2$, $K_3$, $K_4$, $K_5$, $K_6$, $K_7$, $K_8$, comprises a combination of several transistors, and preferably consists of such a combination of several transistors. Alternatively, the switch $K_1$, $K_2$, $K_3$, $K_4$, $K_5$, $K_6$, $K_7$, $K_8$, comprises a mechanical switch, such as a MEMS (MicroElectroMechanical System) microswitch.

The transistor is, for example, an insulated gate field effect transistor, also known as a MOSFET (Metal Oxide Semiconductor Field Effect Transistor). Alternatively, the transistor is a bipolar transistor; an insulated gate bipolar transistor, also known as an IGBT (Insulated Gate Bipolar Transistor); a silicon (Si) based transistor; a GaN (Gallium Nitride) based transistor; a silicon carbide (SiC) based transistor; or a diamond-based transistor; or a thyristor.

Each piezoelectric assembly 12 consists of one of the group consisting of: a single piezoelectric element 15; a plurality of piezoelectric elements 15 connected in series; a plurality of piezoelectric elements 15 connected in parallel; a piezoelectric element 15 and an auxiliary capacitor, not shown, connected in series; a piezoelectric element 15 and an auxiliary capacitor connected in parallel; and an arrangement of a plurality of parallel branches, each branch comprising one or more piezoelectric elements 15 connected in series or an auxiliary capacitor.

The auxiliary capacitor is typically larger, preferably at least three times larger, than a reference capacitance $C_0$ of the piezoelectric element(s) 15.

When the converter 10 comprises two piezoelectric assemblies 12, according to an optional complement, the two piezoelectric assemblies 12 share a common piezoelectric material, while having the electrodes of one piezoelectric assembly 12 be distinct from those of the other piezoelectric assembly 12. According to this optional addition, the electrode pairs of one piezoelectric assembly 12, and respectively those of the second piezoelectric assembly 12, cover distinct material surfaces. Furthermore, the electrodes of a first piezoelectric assembly 12 cannot in this case directly induce a significant electric field in the part of the piezoelectric material belonging to the other piezoelectric assembly 12. According to this further optional complement, the capacitance between any one of the electrodes of one piezoelectric assembly 12 and any one of the electrodes of the other piezoelectric assembly 12 is negligible (at least 10 times smaller) compared to the reference capacitance $C_0$ of each of the piezoelectric assemblies 12, e.g. by not directly facing each other across the material. This pooling of the same material makes it possible, for example, to facilitate the implementation of the piezoelectric assemblies 12, (limitation of the number of part(s), pooling of the fastening means); and also to synchronise the vibration of the two piezoelectric assemblies, without there being a significant transfer of energy from one assembly to the other ($<\frac{1}{10}^{th}$ of the output power).

The piezoelectric element 15 is known per se, and is typically modelled, close to the resonance mode operated, as a capacitor 52 and a resonant branch 54 connected in parallel to the capacitor 52, the capacitor 52 and resonant branch 54 being connected between a first electrode 56 and a second electrode 58 of the piezoelectric element 15, as illustrated in the modelling of the piezoelectric element 15 shown in a bubble 60 in FIG. 1. The resonant branch 54 is typically an RLC branch formed by a capacitor 62, a resistor 64 and a coil 66 connected in series. The capacitance of the capacitor 52 connected in parallel with the resonant branch 54 is called the parallel capacitance, or blocked capacitance, or reference capacitance, and is denoted $C_0$. The voltage at the terminals of the piezoelectric element 15 then typically corresponds to the voltage at the terminals of the capacitor 52.

In the present description, a so-called total piezoelectric voltage $V_p$ is by convention the voltage across the piezoelectric assembly 12 if the converter 10 comprises a single piezoelectric assembly 12; or the sum of each of the voltages across the piezoelectric assemblies 12 if the converter 10 comprises a plurality of piezoelectric assemblies 12. In particular, when the converter 10 comprises two piezoelectric assemblies 12, namely a first piezoelectric assembly and a second piezoelectric assembly, each connected between a respective pair of first 38 and second 48 midpoints, the voltage across the first piezoelectric assembly is denoted $V_{p1}$, and that across the second piezoelectric assembly is denoted $V_{p2}$. The total piezoelectric voltage $V_p$ is then equal to the sum of these voltages $V_{p1}$ and $V_{p2}$, i.e. $V_{p1}+V_{p2}$. The two piezoelectric assemblies 12 are preferably identical, and have substantially the same voltage at their terminals within a possible offset voltage $V_{offset}$, so that the voltages $V_{p1}$ and $V_{p2}$ are equal to $V_p/2+/-V_{offset}$, according to the following equations:

$$V_p = V_{p1} + V_{p2} \quad [1]$$

$$V_{p1} = \frac{V_p}{2} + V_{offset} \, et \, V_{p2} = \frac{V_p}{2} - V_{offset} \quad [2]$$

The voltage $V_{offset}$ is a substantially constant component across a resonant period and has little impact on the charge or energy balance over a period. This voltage $V_{offset}$ evolves slowly with respect to the control frequency, its ripple is typically at a frequency at least 10 times lower than the control frequency of the piezoelectric assembly(-ies) 12. Moreover, when the voltages $V_{p1}+V_{p2}$ are added together, this offset voltage $V_{offset}$ disappears, and we obtain the total piezoelectric voltage $V_p$, as described in the different cycles. In practice, this voltage $V_{offset}$ does not affect the control law, and allows completely independent potentials $V_{inn}$ and $V_{outn}$ at low frequency.

Furthermore, in the present description and as shown in FIGS. 1, 5, 6, and 9, the voltage between the first midpoints 38 is denoted $V_{pa}$, and is by convention equal to the difference in potentials ($V_{pa1}-V_{pa2}$), where $V_{pa1}$ is the potential of the first midpoint 38 connected to the first piezoelectric assembly, and $V_{pa2}$ is the potential of the other first midpoint 38 connected to the second piezoelectric assembly. The voltage between the second midpoints 48 is denoted $V_{pb}$, and is by convention equal to the difference in potentials ($V_{pb1}-V_{pb2}$), where $V_{pb1}$ is the potential of the second midpoint 48 connected to the first piezoelectric assembly, and $V_{pb2}$ is the potential of the other second midpoint 48 connected to the second piezoelectric assembly when the latter is present.

By convention and as shown in FIGS. 1, 5 and 6, the voltage across the first piezoelectric assembly $V_{p1}$ is equal to the difference in potentials ($V_{pa1}-V_{pb1}$), and that across the second piezoelectric assembly $V_{p2}$ is equal to the difference in potentials ($V_{pb2}-V_{pa2}$).

The resonant frequency is the frequency at which the piezoelectric element 15 oscillates and therefore its current $I_L$, visible in FIG. 1. The conversion cycle is synchronised to a mechanical movement of the piezoelectric element 15, and the control frequency is then set to the mechanical oscillation frequency. In practice, this oscillation frequency depends on the operating point of the converter 10: Values of the three voltage steps and the output current. Depending on the operating point, this oscillation frequency typically fluctuates between the so-called series resonance frequency of the piezoelectric element 15 ($\omega_s=1/\sqrt{(L_r \cdot C_r)}$ where $L_r$ and $C_r$ correspond to the inductance and capacitance of the resonant branch 54 and the so-called parallel resonance frequency of the piezoelectric element 15 ($\omega_p=1/\sqrt{(L_r \cdot C_r \cdot C_0/(C_r+C_0))}$), also respectively called the resonance frequency and the anti-resonance frequency of the piezoelectric element 15. The operating frequency of the converter 10 is then between these two resonance and antiresonance frequencies of the piezoelectric element 15. The operating point varies slowly with respect to the oscillation frequency of the piezoelectric element 15. The operating point typically changes at less than 10 kHz, while the oscillation frequency of the piezoelectric element 15 is typically 100 kHz or more. As a result, the operating frequency of the converter 10 changes little from one period to the next.

Generally speaking, for the electrical energy converter 10 with the piezoelectric assembly 12 and controlled by the electronic control device 20, the number of phases at a substantially constant voltage is typically at least 2, preferably equal to 3, while it may be greater than or equal to 4 with the implementation of the control described in the application FR 21 07345 filed on 7 Jul. 2021.

Each phase with a substantially constant voltage is obtainable from a combination of the input and output voltages, in positive or negative values, or is at zero voltage. The energy converter 10 then allows energy to be exchanged between phases with substantially constant voltage, and consequently with the voltages or voltage combinations used to achieve these phases at substantially constant voltage. In particular, it is possible to transfer energy from a low-voltage, substantially constant voltage phase to a higher-voltage, substantially constant voltage phase, and by the above combinations ultimately obtain a step-down converter, which may seem counter-intuitive. Conversely, it is also possible to transfer energy from a higher-voltage, substantially constant voltage phase to a lower-voltage, substantially constant voltage phase, and by the above combinations ultimately obtain a voltage step-up converter. The skilled person will then understand that it is possible to have a step-up cycle seen by the piezoelectric assembly 12 while the electrical energy converter 10 is a step-down converter, and conversely to have a step-down cycle seen by the piezoelectric assembly 12 while the electrical energy converter 10 is a step-up converter.

By convention, if power is supplied to the piezoelectric assembly 12 in phase II, IV, VI at a substantially constant voltage corresponding to the highest voltage during a resonant cycle, then the cycle is considered a step-down cycle for the piezoelectric assembly 12. Conversely, if power is delivered, or drawn, from the piezoelectric assembly 12 during said substantially constant voltage phase at which the voltage is highest during the resonance cycle, then the cycle is considered to be a step-up cycle for the piezoelectric assembly 12. As noted above, the conversion cycle seen by the piezoelectric assembly 12 is likely to be a step-up cycle while the electrical energy converter 10 is operating as a step-down converter, and conversely the conversion cycle seen by the piezoelectric assembly 12 is likely to be a step-down cycle while the electrical energy converter 10 is operating as a step-up converter.

The electronic control device 20 is configured to control the electrical energy converter 10, in particular to control the switches $K_1$, $K_2$, $K_3$, $K_4$, $K_5$, $K_6$, $K_7$, $K_8$ of the converter, in order to alternate phases with a substantially constant voltage across the piezoelectric assembly 12 and phases with a substantially constant charge, i.e. in a substantially open circuit, across said piezoelectric assembly 12.

The electronic control device 20 is, for example, designed as an electronic circuit with one or more electronic components.

Alternatively, the electronic control device 20 is implemented as a programmable logic component, such as Field-Programmable Gate Arrays (FPGAs), or as a dedicated integrated circuit, such as Application-Specific Integrated Circuits (ASICs), or as a computer, such as a microcontroller or processor.

Each switching aid circuit 50 is configured, via the flow of a previously received current $I_{CALC}$, to discharge at least one parasitic capacitance of a switch 36, 46, preferably a switch to be closed, of the respective switching bridge 30, 40 to which it is connected; respectively to charge at least one parasitic capacitance of another switch 36, 46, preferably a switch to be opened or kept open, of said switching bridge 30, 40.

Each of the switches of said switching bridge 30 is opened when the previously received current flows through the switching aid circuit 50.

As a result of this current flow, the switch(es) 36, 46 whose parasitic capacitance has been discharged by the switching aid circuit 50 is/are closed. The other switch(es) 36, 46 whose parasitic capacitance has been charged by the switching aid circuit 50 remain(s) open.

Each switching aid circuit 50 is free of a controllable switch, and in particular each switching aid circuit 50 is free of a transistor. In other words, each switching aid circuit 50 does not comprise a controllable switch, in particular each switching aid circuit 50 does not comprise a transistor.

Each switching aid circuit 50 comprises, for example, an inductor 70; or a first assembly of the inductor 70 and a diode 72 connected in series; or a second assembly of the inductor 70 and a capacitor 74 connected in series; or an additional piezoelectric element 76, as shown in FIG. 2.

Each switching aid circuit 50 is for example an inductor 70, the inductor 70 preferably consisting of a coil and a magnetic circuit. Alternatively, each switching aid circuit 50 is in the form of the first assembly of series-connected inductor 70 and diode 72, and preferably consists of said first assembly of inductor 70 and diode 72. In yet another alternative, each switching aid circuit 50 is in the form of the second assembly of series-connected inductor 70 and capacitor 74, and preferably consists of said first assembly of inductor 70 and capacitor 74. Alternatively, each switching aid circuit 50 is in the form of the additional piezoelectric element 76, and preferably consists of the additional piezoelectric element 76.

The previously received current $I_{CALC}$ is obtained in at least one substantially constant voltage phase, the at least one substantially constant voltage phase then preceding the discharging of the at least one parasitic capacitance of a switch 36, 46, and respectively the charging of the at least one parasitic capacitance of a further switch 36, 46, by the respective switching aid circuit 50. The skilled person will then understand that the obtaining of the current $I_{CALC}$ subsequently used for the switching aid is obtained during one or more substantially constant voltage phases which precede the switching aid, i.e. are prior to the switching aid. Indeed, as mentioned above, the current $I_{CALC}$ is received beforehand, i.e. received before the switching aid is implemented, in particular to facilitate the discharge of the at least one parasitic capacitance of a switch 36, 46, and the charging of the at least one parasitic capacitance of another switch 36, 46, respectively. Different examples of obtaining the current $I_{CALC}$ are described below.

In the embodiment where the switching aid circuit 50 is in the form of the inductor 70 alone, the inductor 70 has its current increase over a half-period, i.e. when the voltage across it is positive; and then its current decrease over the other half-period, i.e. when the voltage across it is negative. This embodiment of the switching aid circuit 50 preferably requires that the voltage across the terminals of the inductor 70 be substantially zero on average, otherwise there is a risk of current drift. If the switching aid circuit 50 is connected to the second bridge 40, in particular between the second midpoints 48, the voltage across the terminals of the inductor 70 is the voltage $V_{pb}$. By extension, the switching aid circuit 50 is connected to the first bridge 30, in particular between the first midpoints 38, the voltage across the terminals of the inductor 70 is the voltage $V_{pa}$.

The variant where the switching aid circuit 50 is in the form of the inductor 70 and the diode 72 connected in series, allows the inductor 70 to be charged only over half a period with the correct polarity, in particular for cycles where the current $I_{CALC}$ is received during a time period with only one polarity, for example between the times $t_2$ and $t_3$ for the step-down cycles A1 and A2 described below (positive polarity of the current $I_{CALC}$ for the step-down cycle A1 between the times $t_2$ and $t_3$, negative polarity for the step-down cycle A3 between these times $t_2$ and $t_3$). In particular, the diode 72 then avoids charging the inductor 70 with a reverse current between the times t3 and T. This unidirectional current operation also reduces the effective current seen by the inductor 70 and therefore the losses. Furthermore, the switching aid circuit 50 according to this variant is not sensitive to the presence of a DC component as long as the DC component is in the direction of blocking the diode 72.

The variant where the switching aid circuit 50 is in the form of the inductor 70 and the capacitor 74 connected in series, makes it possible—compared to the example of the inductor 70 alone—to reduce or even eliminate a possible DC component. Nevertheless, the 74 capacitor can be quite large. Indeed, the voltage at the terminals of the capacitor 74 must change little, i.e. in a small proportion, compared to the input voltage $V_{in}$ or the output voltage $V_{out}$, for example have an amplitude of less than 50% of the input voltage $V_{in}$ or output voltage $V_{out}$.

According to the variant where the switching aid circuit 50 is in the form of the additional piezoelectric element 76, from the moment the converter 10 is controlled between the resonance and anti-resonance frequency of the additional piezoelectric element 76, the latter starts to oscillate and to produce a current $I_{CALC}$ substantially in quadrature with the voltage at its terminals, such as the voltage $V_{pb}$ if the additional piezoelectric element 76 is connected to the second bridge 40 between the second midpoints 48, or the voltage $V_{pa}$ if the additional piezoelectric element 76 is connected to the first bridge 30 between the first midpoints 38. The current $I_{CALC}$ then passes through an extrema around the time t3 for the step-down cycles A1 and A2, which ensures the voltage inversion function $V_{pb}$ between the times $t_2$ and $t_3$; or similarly around the time $t_0$ for the step-up cycles E1 and E2 described below, which ensures the voltage inversion function $V_{pa}$ between the times $t_0$ and $t_1$.

The additional piezoelectric element 76 is typically at least 3 times smaller than the piezoelectric element(s) 15 of the converter 10, the additional piezoelectric element 76 only having to charge/discharge the parasitic capacitances of the switches 36, 46. The parasitic capacitance of the switches 36, 46 is indeed considered to be at least three times lower than the reference capacitance $C_0$ of the piezoelectric element(s) 15 of the converter 10. This variant where the switching aid circuit 50 is in the form of the additional piezoelectric element 76 is insensitive to any DC component (regardless of its polarity), and the switching aid circuit 50 is suitable for connection to both the first bridge 30 (voltage $V_{pa}$) and the second bridge 40 (voltage $V_{pb}$).

In other words, the reference capacitance of the additional piezoelectric element 76 is at least three times less than the reference capacitance $C_0$ of each piezoelectric assembly 12 connected between respective first 38 and second 48 midpoints.

Figure 3:
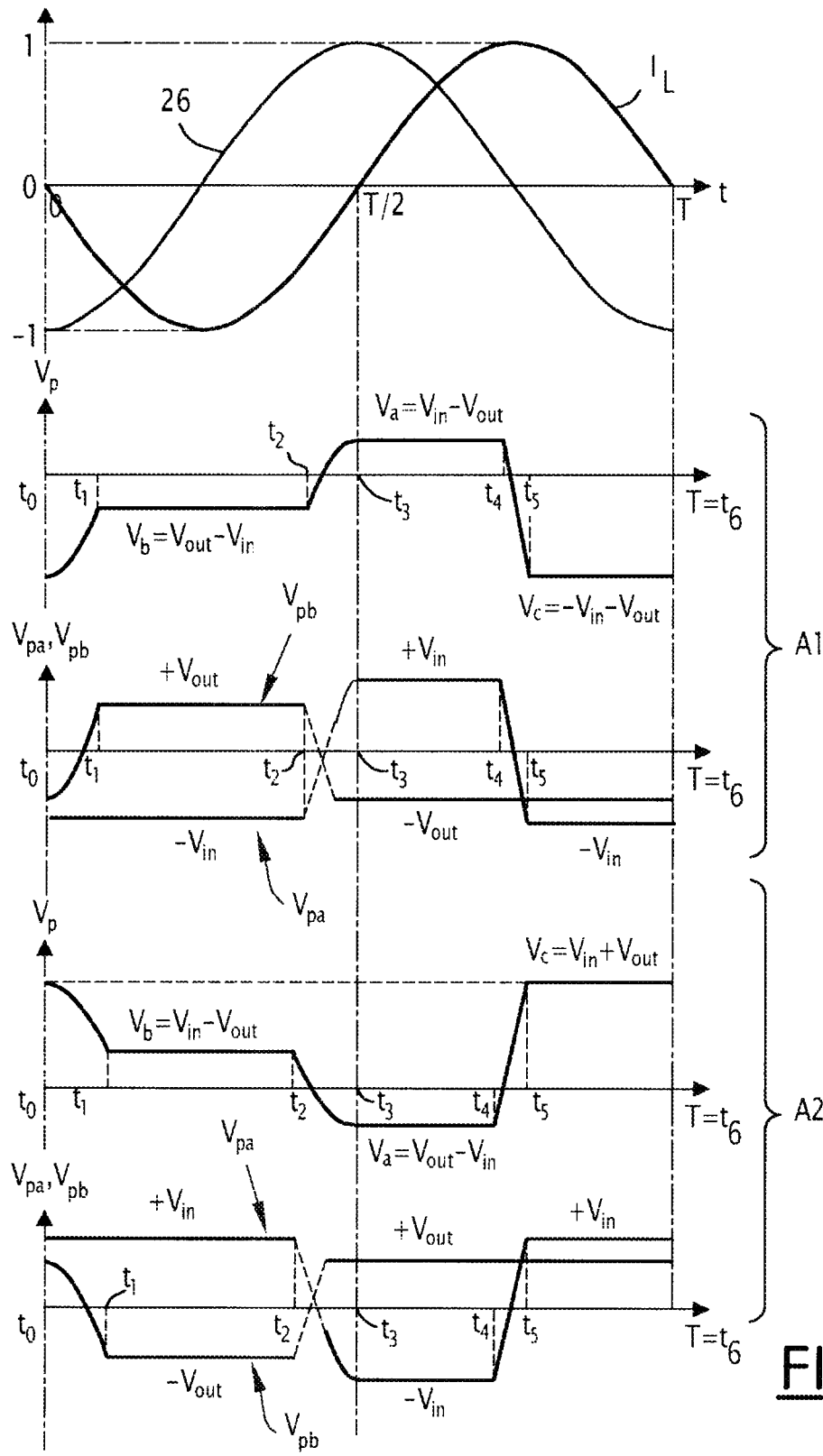
FIG. 3 is a set of curves representing a current flowing in the piezoelectric assemblies normalized to an amplitude of 1, a total mechanical deformation of the piezoelectric assemblies normalized to an amplitude of 1, a voltage between ends of said pair of piezoelectric assemblies, a voltage between the other ends of said pair of piezoelectric assemblies, and a total voltage of the piezoelectric assemblies corresponding to the sum of said elementary voltages at the terminals of each piezoelectric assembly, and this for different configurations of electrical energy conversions, namely for two step-down configurations.

The operation of the converter 10 in the example of FIG. 1 will now be explained according to two step-down configurations, namely a first step-down configuration A1 and a second step-down configuration A2 as shown in FIG. 3. The difference resulting from the switching aid circuit 50 according to the invention relates to the changes in the voltages $V_{pa}$ and $V_{pb}$ between the times $t_2$ and $t_3$ in the case of these step-down configurations A1, A2, and more particularly to the areas shown as dotted lines in FIG. 3 to mark the difference.

The conversion cycle of the converter 10 according to the invention is described below for the first A1 and second A2 step-down configurations, focusing on the differences with respect to the conversion cycle of a converter 10 of the prior art for the same step-down configurations.

The skilled person will note that a very high step-up configuration typically means a configuration where the gain, i.e. the ratio of the output voltage $V_t$ divided by the input voltage $V_{in}$, is greater than 2, i.e. $V_{out}/V_{in} > 2$. By extension, a very low step-down configuration typically means a configuration where the gain, i.e. the ratio of the output voltage $V_{out}$ divided by the input voltage $V_{in}$, is lower than ½, i.e. $V_{out}/V_{in} < ½$.

Similarly, a step-up configuration is typically one where said gain is between 1 and 2, i.e. $V_{in} < V_{out} < 2V_{in}$. By extension, a step-down configuration is typically one where said gain is between ½ and 1, i.e. $V_{in}/2 < V_{out} < V_{in}$.

For the first step-down configuration A1, between the times $t_1$ and $t_2$, according to the example of the switching aid circuit 50, the inductor 70 or the additional piezoelectric element 76 sees its current $I_{CALC}$ increase, under the voltage $V_{pb}$ equal to $+V_{out}$. At time $t_2$, the current $I_{CALC}$ is positive.

Just before time $t_2$, the total piezoelectric voltage $V_p$ is equal to $-V_{in}+V_{out}$, the voltage $V_{pa}$ being equal to $-V_{in}$, and the voltage $V_{pb}$ being equal to $+V_{out}$; and the switches $K_5$, $K_8$, $K_1$, $K_4$ are closed.

At time $t_2$, all switches that were closed open. The current $I_{CALC}$ then charges the parasitic capacitances of switches $K_1$, $K_4$, while discharging the parasitic capacitances of switches $K_2$ and $K_3$. Similarly, through the slowly evolving piezoelectric assemblies 12, the current $I_{CALC}$ partially charges the parasitic capacitances of switches $K_5$, $K_8$, while partially discharging the parasitic capacitances of switches $K_6$, $K_7$. The voltage $V_{pb}$ thus changes from $+V_{out}$ to $-V_{out}$, while the voltage $V_{pa}$ changes substantially from $-V_{in}$ to $-V_{in}+2V_{out}$ plus the change of the total piezoelectric voltage $V_p$ since time $t_2$.

The voltage inversion $V_{pb}$ is considered completed before the total piezoelectric voltage $V_p$ reaches the next step $V_a$. Indeed, even if the amplitude of the current $I_{CALC}$ in the switching aid circuit 50 is much smaller than the amplitude of the internal current $I_L$ of the piezoelectric elements 15 (for example at least 3 times smaller to limit its size), it nevertheless only has to charge/discharge the parasitic capacitances of the switches 36, 46 considered much smaller than the reference capacitance $C_0$ of the piezoelectric elements 15 (at least a factor of 3). Furthermore, the current $I_{CALC}$ in the switching aid circuit 50 approaches its maximum value at time $t_3$, while the internal current $I_L$ approaches 0 at said time $t_3$.

Once complete reversal of the voltage $V_{pb}$ is achieved (from $V_{out}$ to $-V_{out}$), then switches $K_2$ and $K_3$ are closed so that the voltage $V_{pb}$ is fixed, while the voltage $V_{pa}$ continues to rise to $V_{in}$ due to the natural increase in the total piezoelectric voltage $V_p$.

At time $t_3$, switches $K_6$ and $K_7$ are closed. Switches $K_2$ and $K_3$ are also closed if this has not been done already, i.e. if the voltage $V_{pb}$ has not yet reached $-V_{out}$.

In addition, if the switches $K_2$ and $K_3$ have an intrinsic reverse diode or an additional diode in parallel, they can be switched on naturally according to the sign of the internal current $I_L$ after time $t_3$, or according to the residual current $I_{CALC}$ before time $t_3$.

The remainder of the conversion cycle of the converter 10 according to the invention remains substantially unchanged from the conversion cycle of the prior art.

The voltage swing of the total piezoelectric voltage $V_p$ is thus limited between the times $t_2$ and $t_4$, ranging from $-V_{in}+V_{out}$ to $V_{in}-V_{out}$ instead of from $-V_{in}+V_{out}$ to $+V_{in}+V_{out}$ with the converter 10 of the prior art, i.e. a swing of $2V_{in}-2V_{out}$ instead of $2V_{in}$, while ensuring zero-voltage switching of switches 36, 46.

For the second step-down configuration A2, between the times $t_1$ and $t_2$, according to the example of the switching aid circuit 50, the inductor 70 or the additional piezoelectric element 76 sees its current $I_{CALC}$ decrease, under the voltage $V_{pb}$ equal to $-V_{out}$. At time $t_2$, the current $I_{CALC}$ is negative.

Just before time $t_2$, the total piezoelectric voltage $V_p$ is equal to $V_{in}-V_{out}$, the voltage $V_{pa}$ being equal to $V_{in}$, and the voltage $V_{pb}$ being equal to $-V_{out}$; and the switches $K_6$, $K_7$, $K_2$, $K_3$ are closed.

At time $t_2$, all switches that were closed open. The current $I_{CALC}$ then charges the parasitic capacitances of switches $K_2$, $K_3$, while discharging the parasitic capacitances of switches $K_1$ and $K_4$. Similarly, through the slowly evolving piezoelectric assemblies 12, the current $I_{CALC}$ partially charges the parasitic capacitances of switches $K_6$, $K_7$, while partially discharging the parasitic capacitances of switches $K_5$, $K_8$. The voltage $V_{pb}$ thus changes from $-V_{out}$ to $+V_{out}$, while the voltage $V_{pa}$ changes substantially from $+V_{in}$ to $+V_{in}-2V_{out}$ plus the change of the total piezoelectric voltage $V_p$ since time $t_2$.

The voltage inversion $V_{pb}$ is considered completed before the total piezoelectric voltage $V_p$ reaches the next step $V_a$. Indeed, even if the amplitude of the current $I_{CALC}$ in the switching aid circuit 50 is much smaller than the amplitude of the internal current $I_L$ of the piezoelectric elements 15 (for example at least 3 times smaller to limit its size), it nevertheless only has to charge/discharge the parasitic capacitances of the switches 36, 46 considered much smaller than the reference capacitance $C_0$ of the piezoelectric elements 15 (at least a factor of 3). Furthermore, the current $I_{CALC}$ in the switching aid circuit 50 approaches its maximum value (its negative extreme) at time $t_3$, while the internal current $I_L$ approaches 0 at said time $t_3$.

Once complete reversal of the voltage $V_{pb}$ is achieved (from $-V_{out}$ to $+V_{out}$), then switches $K_1$ and $K_4$ are closed so that the voltage $V_{pb}$ is fixed, while the voltage $V_{pa}$ continues to rise to $-V_{in}$ due to the natural decrease in the total piezoelectric voltage $V_p$.

At time $t_3$, switches $K_5$ and $K_8$ are closed. Switches $K_1$ and $K_4$ are also closed if this has not been done already, i.e. if the voltage $V_{pb}$ has not yet reached $+V_{out}$.

In addition, if the switches $K_1$ and $K_4$ have an intrinsic reverse diode or an additional diode in parallel, they can be switched on naturally according to the sign of the internal current $I_L$ after time $t_3$, or according to the residual current $I_{CALC}$ before time $t_3$.

The remainder of the conversion cycle of the converter 10 according to the invention remains substantially unchanged from the conversion cycle of the prior art.

The voltage swing of the total piezoelectric voltage $V_p$ is thus limited between the times $t_2$ and $t_4$, ranging from $V_{in}-V_{out}$ to $V_{out}-V_{in}$, instead of from $V_{in}-V_{out}$ to $-V_{in}-V_{out}$ with the converter of the prior art, i.e. a swing of $2V_{in}-2V_{out}$ instead of $2V_{in}$, while ensuring zero-voltage switching of switches 36, 46.

Figure 4:
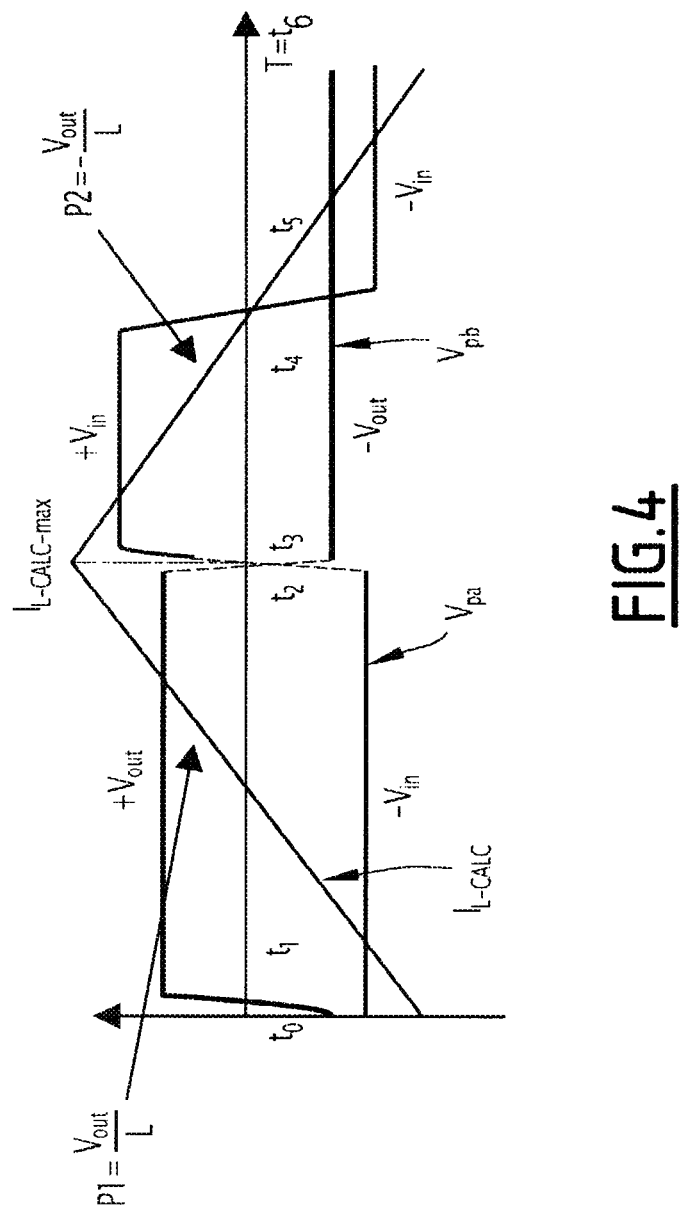
FIG. 4 is a set of curves representing the evolution of the current flowing in the switching aid circuit, when it consists of an inductor.

FIG. 4 shows an example of the sizing of the inductor 70 of the switching aid circuit 50.

During the operation of the switching aid circuit 50, the parasitic capacitances of the switches 36, 46 of a respective switching bridge 30, 40 which were closed just before are charged, and the parasitic capacitances of the switches 36, 46 of a respective switching bridge 30, 40 which were open just before are discharged. When the switching bridge 30, 40 comprises two switching branches 32, 42, the parasitic capacitances of one half of the switches 36, 46 are charged and the parasitic capacitances of the other half of the switches 36, 46 are discharged. $C_{para\_tot}$ is the total parasitic capacitance of the switches 36, 46 to be charged, this being considered equal to the total capacitance of the switches 36, 46 to be discharged, by symmetry of the switches 36, 46.

The voltage swing over these parasitic capacitances due to the action of the switching aid circuit 50 is equal to the minimum voltage between the input voltage $V_{in}$ and the output voltage $V_{out}$ when the switching bridge 30, 40 has two switching branches 32, 42. For a step-down configuration, such as one of the first A1 and second A2 step-down configurations, the voltage swing across these parasitic capacitances is then equal to the output voltage $V_{out}$.

The total electrical load to be provided by the switching aid circuit 50, denoted $Q_{CALC}$, then satisfies the following equation:

$$Q_{CALC}=C_{para\_tot}\cdot\mathrm{Min}(V_{in},V_{out}) \quad [3]$$

For a respective step-down configuration, said total electrical load $Q_{CALC}$ then satisfies the following equation:

$$Q_{CALC}=C_{para\_tot}\cdot V_{out} \quad [4]$$

For a respective step-down configuration, said total electrical load $Q_{CALC}$ then satisfies the following equation:

$$Q_{CALC}=C_{para\_tot}\cdot V_{in} \quad [5]$$

This load $Q_{CALC}$ is ideally exchanged between the times $t_2$ and $t_3$ for the step-down configurations A1 and A2, and an average exchange current, denoted $I_{CALC\_utile}$, then satisfies the following equation:

$$I_{CALC\_utile}=\frac{Q_{CALC}}{(t_3-t_2)}=\frac{C_{para\_tot}\cdot\mathrm{Min}(V_{in},V_{out})}{(t_3-t_2)} \quad [6]$$

For a respective step-down configuration, said average exchange current $I_{CALC\_utile}$ then satisfies the following equation:

$$I_{CALC\_utile}=\frac{C_{para\_tot}\cdot V_{out}}{(t_3-t_2)} \quad [7]$$

The expression of the current in a switching aid circuit 50 consisting of inductor 70, denoted $I_{L\text{-}CALC}$ in this case, typically satisfies the following equation:

$$I_{L\text{-}CALC}=\int\frac{V_{CALC}}{L}dt \quad [8]$$

where $V_{CALC}$ represents the voltage across the switching aid circuit 50, i.e. across the inductor 70, and L represents the inductance of the inductor 70.

In the example of the first step-down configuration A1 of FIG. 3, considering the switching aid circuit 50 placed on the side of the voltage $V_{pb}$, i.e. connected to the second switching bridge 40, as in the example of FIG. 1, the voltage $V_{CALC}$ at the terminals of the switching aid circuit 50, corresponding then to the voltage $V_{pb}$, is substantially equal to $+V_{out}$ between substantially the times $t_0$ and $t_3$ (considering the transition durations from $t_0$ to $t_1$ and from $t_2$ to $t_3$ to be short in comparison with the duration from $t_0$ to $t_3$), and respectively substantially equal to $-V_{out}$ between the times $t_3$ and $t_6$.

When the voltage $V_{CALC}$ across the switching aid circuit 50 is equal to $V_{out}$, the current $I_{L\text{-}CALC}$ in the switching aid circuit 50 increases by $t*V_{out}/L$, i.e. with a first slope P1 equal to $V_{out}/L$. When the voltage $V_{CALC}$ across the switching aid circuit 50 is equal to $-V_{out}$, the current $I_{L\text{-}CALC}$ in the switching aid circuit 50 decreases by $-t*V_{out}/L$, i.e. with a second slope P2 equal to $-V_{out}/L$.

Due to symmetry, the current $I_{L-CALC}$ in the switching aid circuit 50 passes through zero at time T/4, and its value is maximum around time $t_3$ equal to T/2 and is then worth a maximum current $I_{L-CALC-max}$ equal to $T/4*V_{out}/L$, i.e. equal to $T \cdot V_{out}/(4\,L)$.

As the duration between the times $t_2$ and $t_3$ is relatively short compared to the period T of the resonance cycle, the current $I_{L-CALC}$ is considered to be relatively constant between the times $t_2$ and $t_3$ and close to the maximum current $I_{L-CALC-max}$.

The value of the inductance L is then chosen so that the maximum current $I_{L-CALC-max}$ approaches the average exchange current $I_{CALC-utile}$ described above.

The maximum $I_{L-CALC-max}$ and average $I_{CALC-utile}$ exchange currents typically satisfy the following inequation:

$$I_{L-CALC-max} = \frac{T}{4} \cdot \frac{V_{out}}{L} = \frac{T \cdot V_{out}}{4 \cdot L} \geq I_{CALC\_utile} \quad [9]$$

The value of the inductance L then satisfies the following equation:

$$L \leq \frac{T \cdot V_{out}}{4 \cdot I_{CALC\_utile}} \quad [10]$$

A maximum value $L_{max}$ of the inductance L, also known as the maximum inductance $L_{max}$, therefore satisfies the following equation:

$$L = \frac{T \cdot V_{out}}{4 \cdot \frac{C_{para\_tot} \cdot \text{Min}(V_{in}, V_{out})}{(t_3 - t_2)}} = \frac{T \cdot V_{out} \cdot (t_3 - t_2)}{4 \cdot C_{para\_tot} \cdot \text{Min}(V_{in}, V_{out})} \quad [11]$$

For a respective step-down configuration, the maximum inductance $L_{max}$ then satisfies the following equation:

$$L = \frac{T \cdot V_{out}}{4 \cdot \frac{C_{para\_tot} \cdot V_{out}}{(t_3 - t_2)}} = \frac{T \cdot (t_3 - t_2)}{4 \cdot C_{para\_tot}} \quad [12]$$

In this example, the maximum value $L_{max}$ that the inductance L of inductor 70 must not exceed is then deduced from the minimum time $t_3-t_2$ calculated previously, while noting that the smaller the value of inductance L, the higher the value of the maximum current $I_{L-CALC-max}$.

As an example of numerical values, with the total parasitic capacitance $C_{para\_tot}$ for example equal to 100 pF, an operating frequency of the converter 10 of 1 MHz, i.e. the period T of the resonance cycle equal to 1 µs, and a minimum duration $t_3-t_2$ of 50 ns, then the inductance L must be less than the maximum inductance $L_{max}$ equal to 1 µs*50 ns/(4*100 pF), i.e. 125 µH, according to the previous equation (12).

In the variant where the switching aid circuit 50 is in the form of the inductor 70 and the diode 72 connected in series, the current $I_L$ is zero at the time $t_0$, and not at the time T/2, and there is therefore approximately twice as much time $t_0$ to charge the inductor 70, namely the time T/2 instead of the time T/4, which leads, for the same value of the maximum current $I_{L-CALC-max}$, to twice as large a value of the inductance L of the inductor 70.

The skilled person will understand that these are orders of magnitude, that a lower value of the inductance L also works, but induces a higher current and therefore higher losses; and that a higher value of the inductance L leads to an incomplete inversion of the voltage $V_{pb}$ or respectively $V_{pa}$, but is still preferable to a total absence of inversion of said voltage $V_{pb}$ or $V_{pa}$.

Figure 7:
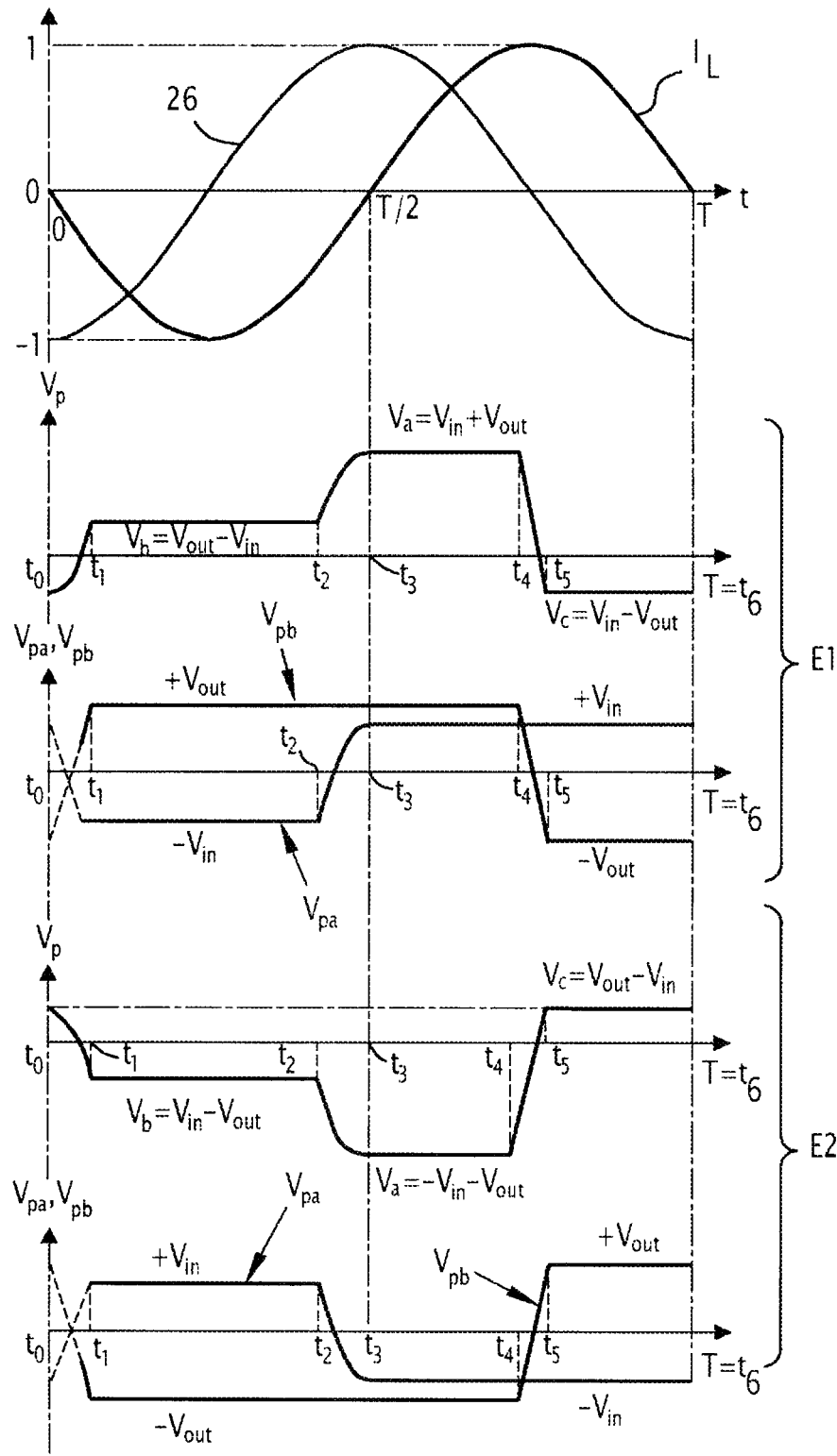
FIG. 7 is a view similar to FIG. 3, for other electrical energy conversion configurations, namely for two voltage step-up configurations, typically according to the second embodiment of the electrical energy converter.

FIGS. 6 and 7 illustrate a second embodiment of the converter 10 in which the switching aid circuit 50 is connected to the first switching bridge 30, for example between the first midpoints 38 of the first two switching branches 32.

According to this second embodiment of the converter 10, the difference from the previously described embodiment is that the switching aid circuit 50 is then connected to the first switching bridge 30 instead of being connected to the second switching bridge 40 according to the first embodiment. The other elements which are unchanged between the first embodiment and the second embodiment are repeated with identical references.

The operation of the converter 10 in the example of FIG. 6 will now be explained according to two step-up configurations, namely a first step-up configuration E1 and a second step-up configuration E2 as shown in FIG. 7. The difference resulting from the switching aid circuit 50 according to the invention relates to the changes in the voltages $V_{pa}$ and $V_{pb}$ between the times $t_0$ and $t_1$ in the case of these step-up configurations E1, E2, and more particularly to the areas shown as dotted lines in FIG. 7 to mark the difference.

The conversion cycle of the converter 10 according to the invention is described below for the first E1 and second E2 step-up configurations, focusing on the differences with respect to the conversion cycle of a converter 10 of the prior art for the same step-up configurations.

For the previously described step-down configurations A1 and A2, it was the voltage $V_{pb}$ that had a homogeneous polarity on each of the two half-periods with a polarity inversion between the two half-periods, and it was therefore preferable to have the switching aid circuit 50 on the $V_{pb}$ side, i.e. connected to the second switching bridge 40, between the respective second midpoints 48.

This time, for these step-up configurations E1 and E2, it is the voltage $V_{pa}$ that has a homogeneous polarity on each of the two half-periods with a polarity inversion between the two half-periods (same polarity on the $V_a$ and $V_c$ steps and opposite polarity on the step $V_b$). For these step-up configurations E1 and E2, it is therefore preferable to arrange the switching aid circuit 50 on the voltage side $V_{pa}$, i.e. connected to the first switching bridge 30, between the respective first midpoints 38. This arrangement of the switching aid circuit 50 on the voltage $V_{pa}$ side is preferable except in the case where the switching aid circuit 50 is in the form of the inductor 70 and the diode 72 connected in series, where the arrangement on the voltage $V_{pb}$ side (i.e. connected to the second switching bridge 40, between the respective second midpoints 48) is still preferable so that the DC component, if any, does not turn the diode 72 to the on state.

For the first step-up configuration E1, between the times $t_3$ and T (or $t_0$), according to the embodiment of the switching aid circuit 50, the inductor 70 or the additional piezoelectric element 76 sees its current $I_{CALC}$ increase, under the voltage $V_{pa}$ equal to $+V_{in}$. At time T (or $t_0$), the current $I_{CALC}$ is positive.

Just before time $t_0$, the total piezoelectric voltage $V_p$ is equal to $V_{in}-V_{out}$, the voltage $V_{pa}$ being equal to $V_{in}$, and the voltage $V_{pb}$ being equal to $-V_{out}$; and the switches $K_6$, $K_7$, $K_2$, $K_3$ are closed.

At time $t_0$, all switches that were closed open. The current $I_{CALC}$ then charges the parasitic capacitances of switches $K_6$, $K_7$, while discharging the parasitic capacitances of switches $K_5$ and $K_8$. Similarly, through the slowly evolving piezoelectric assemblies 12, the current $I_{CALC}$ partially charges the parasitic capacitances of switches $K_2$, $K_3$, while partially discharging the parasitic capacitances of switches $K_1$, $K_4$. The voltage $V_{pa}$ thus changes from $+V_{in}$ to $-V_{in}$, while the voltage $V_{pb}$ changes substantially from $-V_{out}$ to $-V_{out}+2V_{in}$ plus the change of the total piezoelectric voltage $V_p$ since time $t_0$.

The voltage inversion $V_{pa}$ is considered completed before the total piezoelectric voltage $V_p$ reaches the next step $V_b$. Indeed, even if the amplitude of the current $I_{CALC}$ in the switching aid circuit 50 is much smaller than the amplitude of the internal current $I_L$ of the piezoelectric elements 15 (for example at least 3 times smaller to limit its size), it nevertheless only has to charge/discharge the parasitic capacitances of the switches 36, 46 considered much smaller than the reference capacitance $C_0$ of the piezoelectric elements 15 (at least a factor of 3). Furthermore, the current $I_{CALC}$ in the switching aid circuit 50 approaches its maximum value at time $t_0$, while the internal current $I_L$ approaches 0 at said time $t_0$.

Once complete reversal of the voltage $V_{pa}$ is reached (from $V_{in}$ to $-V_{in}$), then switches $K_5$ and $K_8$ are closed so that the voltage $V_{pa}$ is fixed, while the voltage $V_{pb}$ continues to rise to $V_{out}$ due to the natural increase in the total piezoelectric voltage $V_p$.

At time $t_1$, switches $K_1$ and $K_4$ are closed. Switches $K_5$ and $K_8$ are also closed if this has not been done already, i.e. if the voltage $V_{pa}$ has not yet reached $-V_{in}$.

In addition, if the switches $K_1$ and $K_4$ have an intrinsic reverse diode or an additional diode in parallel, they can be switched on naturally according to the sign of the internal current $I_L$ after the time $t_0$.

The remainder of the conversion cycle of the converter 10 according to the invention remains substantially unchanged from the conversion cycle of the prior art.

The voltage swing of the total piezoelectric voltage $V_p$ is thus limited between the times $t_5$ and $t_1$, ranging from $V_{in}-V_{out}$ to $V_{out}-V_{in}$, instead of from $-V_{in}-V_{out}$ to $V_{out}-V_{in}$ with the converter of the prior art, i.e. a swing of $2V_{out}-2V_{in}$ instead of $2V_{out}$, while ensuring zero-voltage switching of switches 36, 46.

For the second step-up configuration E2, between the times $t_3$ and T (or $t_0$), according to the embodiment of the switching aid circuit 50, the inductor 70 or the additional piezoelectric element 76 sees its current $I_{CALC}$ decrease, under the voltage $V_{pa}$ equal to $-V_{in}$. At time T (or $t_0$), the current $I_{CALC}$ is negative.

Just before time $t_0$, the total piezoelectric voltage $V_p$ is equal to $-V_{in}+V_{out}$, the voltage $V_{pa}$ being equal to $-V_{in}$, and the voltage $V_{pb}$ being equal to $+V_{out}$; and the switches $K_5$, $K_8$, $K_1$, $K_4$ are closed.

At time $t_0$, all switches that were closed open. The current $I_{CALC}$ then charges the parasitic capacitances of switches $K_5$, $K_8$, while discharging the parasitic capacitances of switches $K_6$ and $K_7$. Similarly, through the piezoelectric assemblies 12 whose voltage is changing slowly, the current $I_{CALC}$ partially charges the parasitic capacitances of switches $K_1$, $K_4$, while partially discharging the parasitic capacitances of switches $K_2$, $K_3$. The voltage $V_{pa}$ thus changes from $-V_{in}$ to $+V_{in}$, while the voltage $V_{pb}$ changes substantially from $V_{out}$ to $V_{out}-2V_{in}$ plus the change of the total piezoelectric voltage $V_p$ since time $t_0$.

The voltage inversion $V_{pa}$ is considered completed before the total piezoelectric voltage $V_p$ reaches the next step $V_b$. Indeed, even if the amplitude of the current $I_{CALC}$ in the switching aid circuit 50 is much smaller than the amplitude of the internal current $I_L$ of the piezoelectric elements 15 (for example at least 3 times smaller to limit its size), it nevertheless only has to charge/discharge the parasitic capacitances of the switches 36, 46 considered much smaller than the reference capacitance $C_0$ of the piezoelectric elements 15 (at least a factor of 3). Furthermore, the current $I_{CALC}$ in the switching aid circuit 50 approaches its maximum value (its negative extreme) at time $t_0$, while the internal current $I_L$ approaches 0 at said time $t_0$.

Once complete reversal of the voltage $V_{pa}$ is reached (from $-V_{in}$ to $+V_{in}$), then switches $K_6$ and $K_7$ are closed so that the voltage $V_{pa}$ is fixed, while the voltage $V_{pb}$ continues to rise to $V_{out}$ due to the natural decrease in the total piezoelectric voltage $V_p$.

At time $t_1$, switches $K_2$ and $K_3$ are closed. Switches $K_6$ and $K_7$ are also closed if this has not been done already, i.e. if the voltage $V_{pa}$ has not yet reached $+V_{in}$.

In addition, if the switches $K_2$ and $K_3$ have an intrinsic reverse diode or an additional diode in parallel, they can be switched on naturally according to the sign of the internal current $I_L$ after the time $t_0$.

The remainder of the conversion cycle of the converter 10 according to the invention remains substantially unchanged from the conversion cycle of the prior art.

The voltage swing of the total piezoelectric voltage $V_p$ is thus limited between the times $t_5$ and $t_1$, ranging from $V_{out}-V_{in}$ to $V_{in}-V_{out}$, instead of from $+V_{in}+V_{out}$ to $V_{in}-V_{out}$ with the converter of the prior art, i.e. a swing of $2V_{out}-2V_{in}$ instead of $2V_{out}$, while ensuring zero-voltage switching of switches 36, 46.

In the example shown in FIG. 5, the switching aid circuit 50 has the inductor 70 and the diode 72 connected in series, and the diode 72 is oriented according to the direction in which the voltage is to be varied. For example, in the first step-down configuration A1, to change the voltage $V_{pb}$ from $+V_{out}$ to $-V_{out}$, the diode 72 as shown in FIG. 5 is in the wrong direction. For another example, in the second step-down configuration A2, to change the voltage $V_{pb}$ from $-V_{out}$ to $+V_{out}$, the diode 72 as shown in FIG. 5 is in the right direction. The anode of diode 72 must be on the positive terminal side of the voltage to be changed and its cathode on the negative terminal side of the voltage to be changed. Finally, once the orientation of the diode 72 has been determined, it is necessary to ensure that the diode 72 can block any DC component of the voltage, i.e. in this case the average value of the voltage $V_{pb}$, i.e. check that the anode is on the side of the negative terminal of this DC component and that the cathode is on the side of the positive terminal of this DC component. In the example shown in FIG. 5, the orientation of diode 72 allows a positive DC component for the voltage $V_{pb}$. If the diode is ever in the wrong direction with respect to this DC component, then the same must be done on the other switching bridge, and the switching aid circuit 50 must be connected to the other switching bridge.

This example of FIG. 5 with the switching aid circuit 50 in the form of the inductor 70 and the diode 72 connected in series, then corresponds to the case where the arrangement on the voltage side $V_{pb}$ (i.e. connected to the second switching bridge 40, between the respective second midpoints 48) remains preferable so that the possible positive DC component does not make the diode 72 pass (case of the step-down A2 or step-up E1 configurations; or the case of the step-down A1 or step-up E2 configurations if the direction of the diode 72 in FIG. 5 is reversed).

For the first step-up configuration E1, between the times $t_0$ and $t_1$, the voltage $V_{pb}$ changes from $-V_{out}$ to $+V_{out}$. To contribute to this, the current $I_{CALC}$ must be negative, and the diode 72 is then arranged in the opposite direction to the direction conventionally taken for the current $I_{CALC}$. For the second step-up configuration E2, the voltage $V_{pb}$ changes from $-V_{out}$ to $+V_{out}$, and the diode 72 is then arranged in the other direction.

For the first step-up configuration E1, between the times $t_5$ and T (or $t_0$), according to the embodiment of the switching aid circuit 50, the inductor 70 or the additional piezoelectric element 76 sees its current $I_{CALC}$ decrease, under the voltage $V_{pb}$ equal to $-V_{out}$. At time T (or $t_0$), the current $I_{CALC}$ is negative.

Just before time $t_0$, the total piezoelectric voltage $V_p$ is equal to $V_{in}-V_{out}$, the voltage $V_{pa}$ being equal to $V_{in}$, and the voltage $V_{pb}$ being equal to $-V_{out}$; and the switches $K_6$, $K_7$, $K_2$, $K_3$ are closed.

At time $t_0$, all switches that were closed open. The current $I_{CALC}$ then partially charges the parasitic capacitances of switches $K_2$, $K_3$, while partially discharging the parasitic capacitances of switches $K_1$ and $K_4$. Similarly, through the piezoelectric assemblies 12 whose voltage is changing slowly, the current $I_{CALC}$ charges the parasitic capacitances of switches $K_6$, $K_7$, while discharging the parasitic capacitances of switches $K_5$, $K_8$. The voltage $V_{pa}$ thus changes from $+V_{in}$ to $-V_{in}$, while the voltage $V_{pb}$ changes substantially from $-V_{out}$ to $-V_{out}+2V_{in}$ plus the change of the total piezoelectric voltage $V_p$ since time $t_0$. The voltage $V_{pb}$ cannot be reversed completely because as the voltage $V_{in}$ is lower than the voltage $V_{out}$, the voltage $V_{pa}$ reaches $-V_{in}$ before the voltage $V_{pb}$ reaches $+V_{out}$.

The voltage inversion $V_{pa}$ is considered completed before the total piezoelectric voltage $V_p$ reaches the next step $V_b$. Indeed, even if the amplitude of the current $I_{CALC}$ in the switching aid circuit 50 is much smaller than the amplitude of the internal current $I_L$ of the piezoelectric elements 15 (for example at least 3 times smaller to limit its size), it nevertheless only has to charge/discharge the parasitic capacitances of the switches 36, 46 considered much smaller than the reference capacitance $C_0$ of the piezoelectric elements 15 (at least a factor of 3). Furthermore, the current $I_{CALC}$ in the switching aid circuit 50 approaches its maximum value (its negative extreme) at time $t_0$, while the internal current $I_L$ approaches 0 at said time $t_0$.

Once complete reversal of the voltage $V_{pa}$ is reached (from $V_{in}$ to $-V_{in}$), then switches $K_5$ and $K_8$ are closed so that the voltage $V_{pa}$ is fixed, while the voltage $V_{pb}$ continues to rise to $V_{out}$ due to the natural increase in the total piezoelectric voltage $V_p$.

At time $t_1$, switches $K_1$ and $K_4$ are closed. Switches $K_5$ and $K_8$ are also closed if this has not been done already, i.e. if the voltage $V_{pa}$ has not yet reached $-V_{in}$.

In addition, if the switches $K_1$ and $K_4$ have an intrinsic reverse diode or an additional diode in parallel, they can be switched on naturally according to the sign of the internal current $I_L$ after time $t_0$, or according to the residual current $I_{CALC}$ before time $t_0$.

The remainder of the conversion cycle of the converter 10 according to the invention remains substantially unchanged from the conversion cycle of the prior art. In practice, the energy remaining in the inductor 70 is released after time $t_1$ at voltage $V_{out}$ until the current in the inductor 70 is cancelled out and diode 72 is blocked.

The voltage swing of the total piezoelectric voltage $V_p$ is thus limited, ranging from $V_{in}-V_{out}$ to $V_{in}-V_{out}$, instead of from $-V_{in}-V_{out}$ to $+V_{in}+V_{out}$ with the converter of the prior art, i.e. a swing of $2V_{out}$ instead of $2V_{in}+2V_{out}$, while ensuring zero-voltage switching of switches 36, 46.

For the second step-up configuration E2, the operation of the converter 10 with the switching aid circuit 50 in the form of the inductor 70 and the diode 72 is similar to that described with respect to FIG. 7 for the second step-up configuration E2, but with the diode 72 facing in the other direction.

As an optional addition, when the converter 10 comprises two switching aid circuits 50, with the first switching aid circuit connected to the first switching bridge 30 and the second switching aid circuit connected to the second switching bridge 40, then the switching aid circuits 50 being arranged on both the voltage $V_{pa}$ side and the voltage $V_{pb}$ side, the effects of the two switching aid circuits 50 add up. The only thing to do is to choose the switching aid circuit 50 according to the presence or absence of a DC component, and possibly according to the sign of this DC component if there is one.

Alternatively, switches $K_1$, $K_2$, $K_3$ and $K_4$ are single diodes, and switches $K_5$, $K_6$, $K_7$ and $K_8$ are fixed-direction voltage switches.

Figure 8:
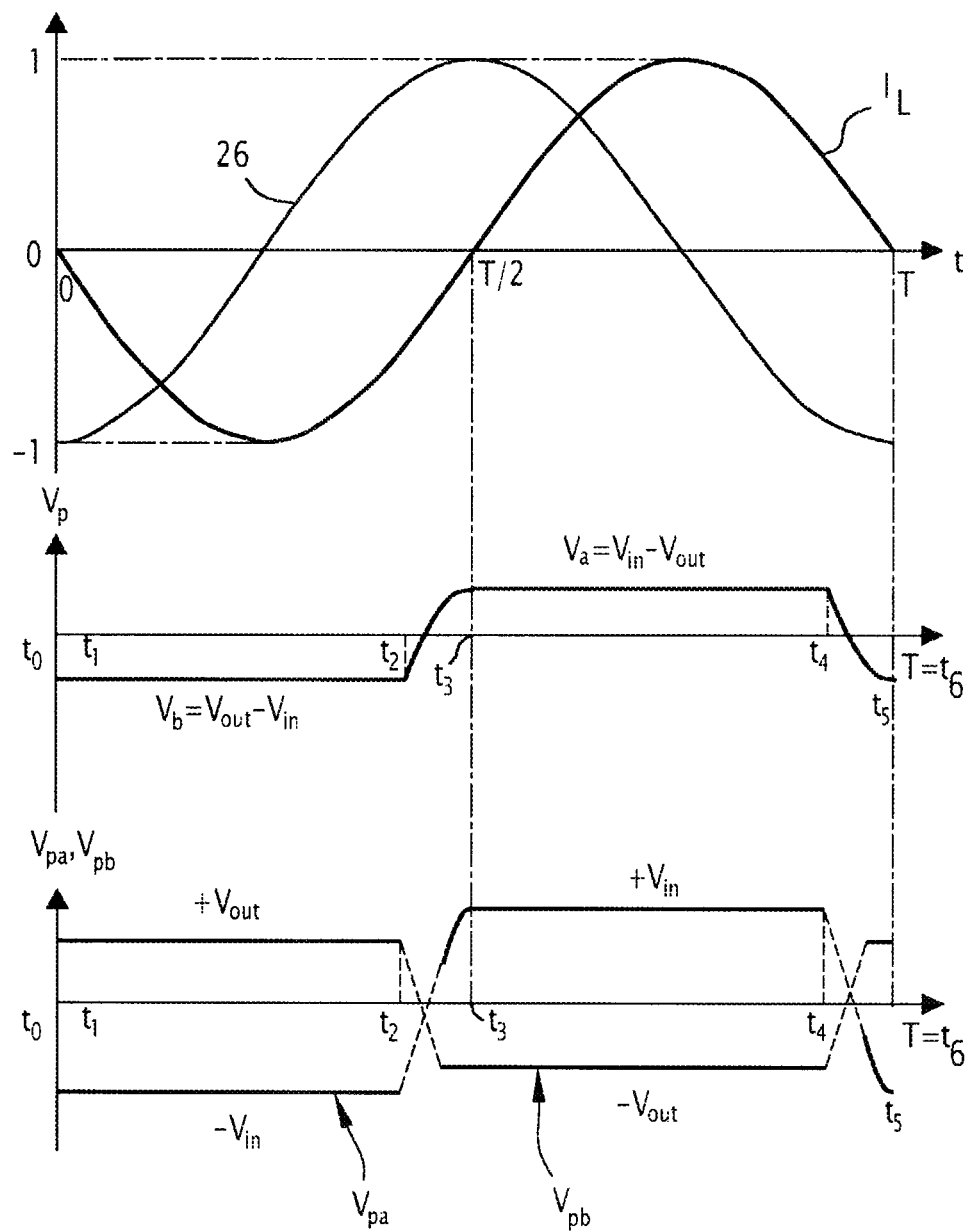
FIG. 8 is a view similar to FIG. 3, according to an embodiment where the input voltage is substantially equal to the output voltage.

The example in FIG. 8 corresponds to the particular case where the output voltage $V_{out}$ is substantially equal to the input voltage $V_{in}$, and the converter 10 is essentially used to isolate the output $V_{out}$ from the input $V_{in}$, without changing its amplitude. In this case, there are only two voltage levels, namely $V_{in}-V_{out}$ and $V_{out}-V_{in}$. The principle of the switching aid circuit 50 still applies, and the switching aid circuit(s) 50 are then suitable to be arranged on the $V_{pa}$ voltage side and/or on the $V_{pb}$ voltage side, the two voltages $V_{pa}$ and $V_{pb}$ being substantially symmetrical. In other words, in this case, the first switching aid circuit is connected to the first switching bridge 30 and/or the second switching aid circuit is connected to the second switching bridge 40.

In practice, to compensate for losses, the input voltage $V_{in}$ is slightly higher than the output voltage $V_{out}$. To improve the readability of FIG. 8, this gap has been slightly exaggerated in FIG. 8.

In the example shown in FIG. 8, the topology is bidirectional, and electrical energy is also transferable from the output to the input. In the latter case, the difference between the input voltage $V_{in}$ and the output voltage $V_{out}$ will be in the other direction. However, due to the perfect symmetry of the converter 10 in this case, operation in the other direction is simply a matter of reversing the input and output of the converter 10 and applying the above lessons.

In the case of FIG. 8, the step $V_c$ has disappeared. The time $t_5$ is then merged with the time $t_6$, and the duration between the times $t_4$ and $t_5$ allows the polarities of the two voltages $V_{pa}$ and $V_{pb}$ to be reversed. Similarly, the duration between the times $t_2$ and $t_3$ allows the polarities of the two voltages $V_{pa}$ and $V_{pb}$ to be reversed. The switching aid(s) 50 then allow the voltages $V_{pa}$ and $V_{pb}$ to be inverted without having the total piezoelectric voltage $V_p$ swing to $V_{in}+V_{out}$, or $-V_{in}-V_{out}$.

The switching aid circuit 50 then allows the voltage swing to be drastically limited, especially as the output voltage $V_{out}$ is close to the input voltage $V_{in}$.

Figure 10:
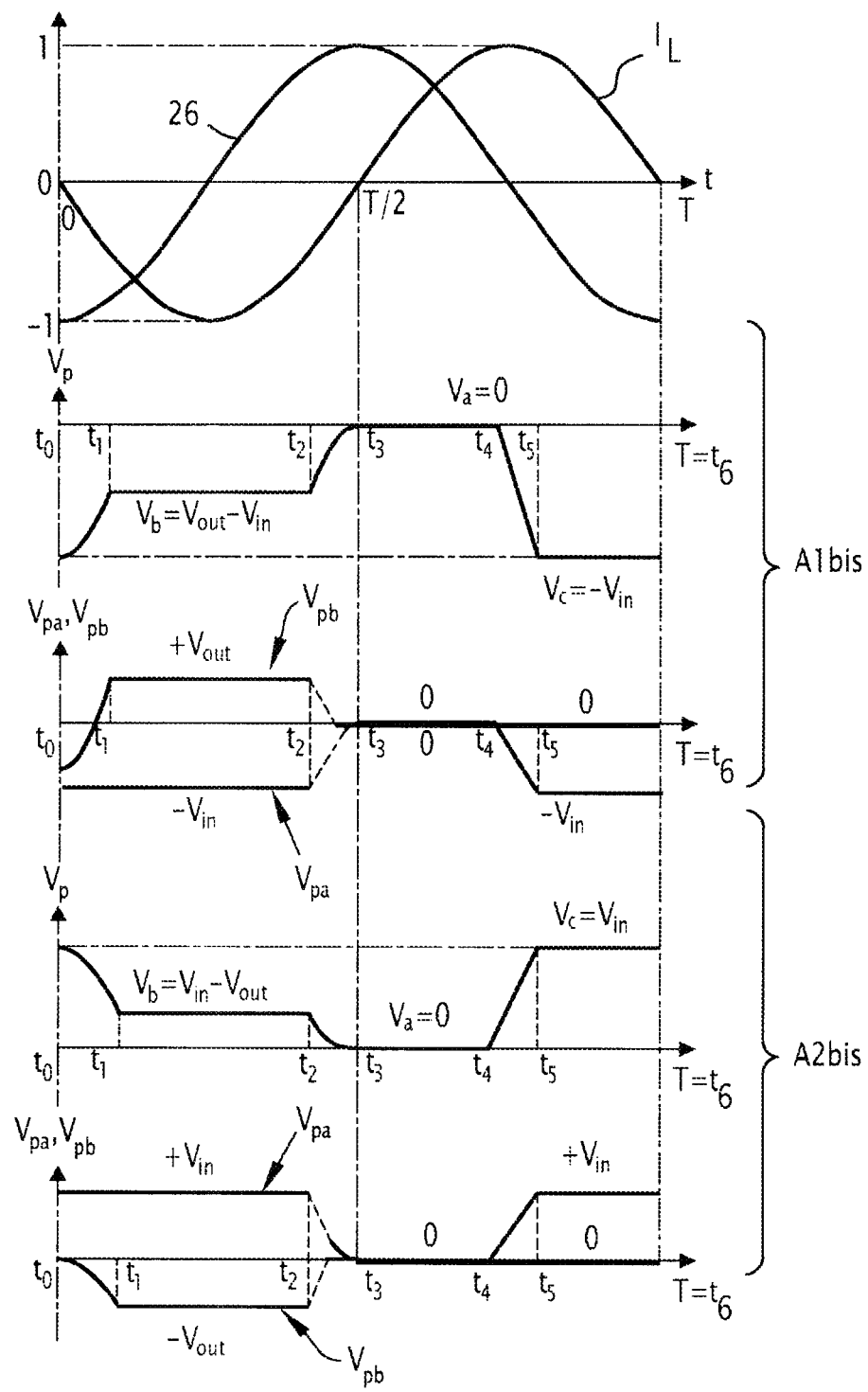
FIG. 10 is a view similar to FIG. 3, for a third embodiment of the electrical energy conversion.

FIGS. 9 and 10 illustrate a third embodiment of the converter 10 in which the first 30 and second 40 switching bridges each comprise a single switching branch 32, 42, whereas according to the first and second embodiments described above, the first 30 and second 40 switching bridges each comprise two switching branches 32, 42. According to this third embodiment, the converter 10 comprises a single piezoelectric assembly 12 connected between the first 30 and second 40 switching bridges, and the total piezoelectric voltage $V_p$ is then the voltage across said piezoelectric assembly 12.

In the example shown in FIG. 9, the switching aid circuit 50 is connected to the first switching bridge 30, typically between the first midpoint 38 and one end of the single first switching branch 32. In this example, the switching aid circuit 50 is then placed on the side of the voltage $V_{pa}$.

In the example shown in FIG. 9, the switching aid circuit 50 is particularly connected between the first midpoint 38 and the application terminal 34 with lower potential $V_{inn}$. It is further noted that the potentials $V_{pa2}$ and $V_{pb2}$ are directly connected to each other, and that the lower potentials $V_{inn}$ and $V_{outn}$ of the application 34 and supply 44 terminals are also connected to each other.

Alternatively, not shown, the switching aid circuit 50 is connected to the second switching bridge 40, typically between the second midpoint 48 and one end of the single second switching branch 42. In this alternative, the switching aid circuit 50 is then placed on the side of the voltage $V_{pb}$.

Other elements which are unchanged from the first and second embodiments described above are repeated with identical references.

As an optional complement, the converter 10 comprises an auxiliary capacitor, not shown, connected between the first 30 and second 40 switching bridges, typically between a respective first midpoint 38 and second midpoint 48, preferably between the first midpoint 38 and the second midpoint 48 to which the piezoelectric assembly 12 is not directly connected. The auxiliary capacitor is typically larger in capacitance, preferably at least three times larger, than the reference capacitance $C_0$ of the piezoelectric element(s) 15 of the piezoelectric assembly 12.

According to this third embodiment, the switching aid circuit 50 is preferably in the form of the additional piezoelectric element 76 or in the form of the inductor 70 and the capacitor 74 connected in series.

The operation of the converter 10 in the example of FIG. 9 will now be explained for the second step-down configuration, here denoted A2bis, as shown in FIG. 10. The difference resulting from the switching aid circuit 50 according to the invention relates to the changes in the voltages $V_{pa}$ and $V_{pb}$ between the times $t_2$ and $t_3$, and more particularly to the areas shown as dotted lines in FIG. 10 to mark the difference.

The conversion cycle of the converter 10 according to the invention is described below for the second step-down configuration A2bis, focusing on the differences with respect to the conversion cycle of a converter of the prior art for the same step-down configuration.

According to this third embodiment, the aim is not to invert the voltage $V_{pa}$ and the voltage $V_{pb}$, but simply to change it from $V_{in}$ to 0 or vice versa for the voltage $V_{pa}$, and respectively from 0 to $V_{out}$ or vice versa for the voltage $V_{pb}$.

For the second step-down configuration A2bis, between the times $t_1$ and $t_2$, according to the example of the switching aid circuit 50, the inductor 70 or the additional piezoelectric element 76 sees its current $I_{CALC}$ increase, under the voltage $V_{pa}$ equal to $V_{in}$. At time $t_2$, the current $I_{CALC}$ is positive.

Just before time $t_2$, the total piezoelectric voltage $V_p$ is equal to $V_{in}-V_{out}$, the voltage $V_{pa}$ being equal to $V_{in}$, and the voltage $V_{pb}$ being equal to $-V_{out}$; and the switches $K_6$, $K_2$ are closed.

At time $t_2$, all switches that were closed open. The current $I_{CALC}$ then partially charges the parasitic capacitance of the switch $K_6$, while partially discharging the parasitic capacitance of the switch $K_5$. Similarly, through the piezoelectric assembly 12 whose voltage is changing slowly, the current $I_{CALC}$ charges the parasitic capacitance of the switch $K_2$, while discharging the parasitic capacitances of the switch $K_1$. The voltage $V_{pb}$ thus changes from $-V_{out}$ to 0, while the voltage $V_{pa}$ changes substantially from $+V_{in}$ to $+V_{in}-V_{out}$ plus the change of the total piezoelectric voltage $V_p$ since time $t_2$.

The voltage inversion $V_{pb}$ is considered completed before the total piezoelectric voltage $V_p$ reaches the next step $V_a$. Indeed, even if the amplitude of the current $I_{CALC}$ in the switching aid circuit 50 is much smaller than the amplitude of the internal current $I_L$ of the piezoelectric assembly 12 (for example at least 3 times smaller to limit its size), it nevertheless only has to charge/discharge the parasitic capacitance of the switch 36, 46 considered much smaller than the reference capacitance $C_0$ of the piezoelectric assembly 12 (at least a factor of 3). Furthermore, the current $I_{CALC}$ in the switching aid circuit 50 approaches its maximum value at time $t_3$, while the internal current $I_L$ approaches 0 at said time $t_3$.

Once complete reversal of the voltage $V_{pb}$ is achieved (from $-V_{out}$ to 0), then the switches $K_1$ is closed so that the voltage $V_{pb}$ is fixed, while the voltage $V_{pa}$ continues to rise to 0 due to the natural decrease in the total piezoelectric voltage $V_p$.

At time $t_3$, the switch $K_5$ is closed. The switch $K_1$ is also closed if this has not been done already, i.e. if the voltage $V_{pb}$ has not yet reached 0.

In addition, if the switch $K_1$ has an intrinsic reverse diode or an additional diode in parallel, it can be switched on naturally according to the sign of the internal current $I_L$ after time $t_3$, or according to the residual current $I_{CALC}$ before time $t_3$.

The remainder of the conversion cycle of the converter 10 according to the invention remains substantially unchanged from the conversion cycle of the prior art.

The skilled person will observe that in the example of FIGS. 9 and 10, the switches $K_1$ and $K_2$ can be simple diodes, which then open and close naturally, i.e. without needing to be controlled by the control device 20.

The skilled person will understand that the first step-down configuration, noted here as A1bis, of FIG. 10, corresponds to the case where the first piezoelectric assembly has been removed, instead of the second piezoelectric assembly as in the example of FIG. 9, and that the switches $K_8$, $K_4$ have been short-circuited instead of the switches $K_7$, $K_3$.

In other words, in this case, the switching aid circuit 50 is particularly connected between the first midpoint 38 and the application terminal 34 with greater potential $V_{inp}$. It is further noted that the potentials $V_{pa1}$ and $V_{pb1}$ are directly connected to each other, and that the greater potentials $V_{inp}$ and $V_{outp}$ of the application 34 and supply 44 terminals are also connected to each other.

For the first step-down configuration A1bis, between the times $t_1$ and $t_2$, according to the example of the switching aid circuit 50, the inductor 70 or the additional piezoelectric element 76 sees its current $I_{CALC}$ decrease, under the voltage $V_{pa}$ equal to $-V_{in}$. At time $t_2$, the current $I_{CALC}$ is negative.

Just before time $t_2$, the total piezoelectric voltage $V_p$ is equal to $V_{out}-V_{in}$, the voltage $V_{pa}$ being equal to $-V_{in}$, and the voltage $V_{pb}$ being equal to $V_{out}$; and the switches $K_5$, $K_1$ are closed.

At time $t_2$, all switches that were closed open. The current $I_{CALC}$ then partially charges the parasitic capacitance of the switch $K_5$, while partially discharging the parasitic capacitance of the switch $K_6$. Similarly, through the piezoelectric assembly 12 whose voltage is changing slowly, the current $I_{CALC}$ charges the parasitic capacitance of the switch $K_1$, while discharging the parasitic capacitances of the switch $K_2$. The voltage $V_{pb}$ thus changes from $+V_{out}$ to 0, while the voltage $V_{pa}$ changes substantially from $-V_{in}$ to $-V_{in}+V_{out}$ plus the change of the total piezoelectric voltage $V_p$ since time $t_2$.

The change in voltage $V_{pb}$ is considered completed before the total piezoelectric voltage $V_p$ reaches the next step $V_a$. Indeed, even if the amplitude of the current $I_{CALC}$ in the switching aid circuit 50 is much smaller than the amplitude of the internal current $I_L$ of the piezoelectric assembly 12 (for example at least 3 times smaller to limit its size), it nevertheless only has to charge/discharge the parasitic capacitance of the switch 36, 46 considered much smaller than the reference capacitance $C_0$ of the piezoelectric assembly 12 (at least a factor of 3). Furthermore, the current $I_{CALC}$ in the switching aid circuit 50 approaches its maximum value (its negative extreme) at time $t_3$, while the internal current $I_L$ approaches 0 at said time $t_3$.

Once the voltage $V_{pb}$ is has completely changed (from $+V_{out}$ to 0), then the switch $K_2$ is closed so that the voltage $V_{pb}$ is fixed, while the voltage $V_{pa}$ continues to rise to 0 due to the natural increase in the total piezoelectric voltage $V_p$.

At time $t_3$, the switch $K_6$ is closed. The switch $K_2$ is also closed if this has not been done already, i.e. if the voltage $V_{pb}$ has not yet reached 0.

In addition, if the switch $K_2$ has an intrinsic reverse diode or an additional diode in parallel, it can be switched on naturally according to the sign of the internal current $I_L$ after time $t_3$, or according to the residual current $I_{CALC}$ before time $t_3$.

The remainder of the conversion cycle of the converter 10 according to the invention remains substantially unchanged from the conversion cycle of the prior art.

It is thus conceivable that the electrical energy converter 10 according to the invention offers improved control through the switching aid circuit 50.

Indeed, the at least one piezoelectric assembly 12 has a capacitive behaviour which induces a slow variation of its voltage, i.e. of the total piezoelectric voltage $V_p$. The search for zero voltage switching, or ZVS, via the natural change in the total piezoelectric voltage $V_p$ towards $V_{in}+V_{out}$ and/or $-V_{in}-V_{out}$ potentials has a cost in terms of duration, with the time period during which there is no power exchange, and also a cost in terms of the over-amplitude necessary on the current $I_L$ to go and find these extreme points of the total piezoelectric voltage $V_p$.

The switching aid circuit 50 thus provides a significant improvement to these problems of the prior art electrical energy converter.

The invention claimed is:

1. An electrical energy converter, comprising:
a first switching bridge comprising at least one first switching branch, each first switching branch being connected between two input voltage application terminals and comprising at least two first switches connected in series and linked together at a first midpoint;
a second switching bridge comprising at least one second switching branch, each second switching branch being connected between two input voltage application terminals and comprising at least two first switches connected in series and linked together at a first midpoint;
at least one piezoelectric assembly, each piezoelectric assembly comprising at least one piezoelectric element and being connected between a respective first midpoint and a respective second midpoint;
at least one switching aid circuit, each switching aid circuit being connected to a respective one of the first and second midpoints, each switching aid circuit being configured to, via the flow of a previously received current, discharge at least one parasitic capacitance of a switch of the respective switching bridge to which it is connected, and respectively charge at least one parasitic capacitance of another switch of said switching bridge.

2. The converter according to claim 1, wherein the switching bridge to which a respective switching aid circuit is connected comprises two switching branches, and said switching aid circuit is then connected between the respective midpoints of the two switching branches of said bridge.

3. The converter according to claim 2, wherein the first switching bridge comprises two first switching branches, and the second switching bridge has two second switching branches; and the converter comprises two piezoelectric assemblies, each connected between respective first and second midpoints, the midpoints between which the piezoelectric assemblies are connected being distinct from one piezoelectric assembly to another.

4. The converter according to claim 1, wherein the switching bridge to which a respective switching aid circuit is connected comprises a single switching branch, and said switching aid circuit is then connected between the midpoint and an end of said switching branch of said bridge.

5. The converter according to claim 1, wherein the converter comprises two switching aid circuits, a first switching aid circuit being connected to the first switching bridge and a second switching aid circuit being connected to the second switching bridge.

6. The converter according to claim 1, wherein each switching aid circuit is free of a controllable switch, each switching aid circuit being in particular free of a transistor.

7. The converter according to claim 1, wherein each switching aid circuit comprises an element selected from the group consisting of: an inductor; a first assembly formed of an inductor and a diode connected in series; a second assembly formed of an inductor and a capacitor connected in series; and an additional piezoelectric element.

8. The converter according to claim 7, wherein each switching aid circuit consists of an element selected from the group consisting of: an inductor; a first assembly formed of an inductor and a diode connected in series; a second assembly formed of an inductor and a capacitor connected in series; and an additional piezoelectric element.

9. The converter according to claim 1, wherein the switching aid circuit comprises an inductor and a diode connected in series, and the diode is oriented according to a direction of flow of the previously received current, the diode being configured to block the flow of a current going from the positive polarity to the negative polarity of a possible direct voltage component of said current.

10. The converter according to claim 1, wherein the switching aid circuit comprises an additional piezoelectric element, each piezoelectric element has a reference capacitance, each piezoelectric element being modelled as a capacitor and a resonant branch connected in parallel to the capacitor, the reference capacitance being the capacitance of said capacitor, and
wherein the reference capacitance of the additional piezoelectric element is at least three times less than the reference capacitance of the piezoelectric element(s) of each piezoelectric assembly connected between respective first and second midpoints.

11. The converter according to claim 1, wherein the switches of the first and second switching bridges can be commanded to alternate between phases of substantially constant voltage across each piezoelectric assembly and phases of substantially constant load across each piezoelectric assembly.

12. The converter according to claim 11, wherein the previously received current is obtained in at least one substantially constant voltage phase preceding the discharge of the at least one parasitic capacitance of a switch and the charging of the at least one parasitic capacitance of another switch, respectively, by the respective switching aid circuit.

13. The converter according to claim 1, wherein each piezoelectric assembly consists of one of the group consisting of: a single piezoelectric element; a plurality of piezoelectric elements connected in series; a plurality of piezoelectric elements connected in parallel; a piezoelectric element and an auxiliary capacitor connected in series; a piezoelectric element and an auxiliary capacitor connected in parallel; and an arrangement of a plurality of parallel branches, each branch comprising one or more piezoelectric elements connected in series or an auxiliary capacitor.

14. The converter according to claim 13, wherein the auxiliary capacitor has a capacitance greater than a reference capacitance of the piezoelectric element(s), each piezoelectric element being modelled as a capacitor and a resonant branch connected in parallel to the capacitor, the reference capacitance being the capacitance of said capacitor.

15. The converter according to claim 14, wherein the auxiliary capacitor has a capacitance at least three times the reference capacitance of the piezoelectric element(s).

16. An electronic system for electrical energy conversion comprising an electrical energy converter and an electronic device for controlling the electrical energy converter, the electrical energy converter being as claimed in claim 1.

* * * * *